United States Patent
Liaw

(10) Patent No.: US 11,758,714 B2
(45) Date of Patent: Sep. 12, 2023

(54) FUSE CELL STRUCTURE

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 526 days.

(21) Appl. No.: 16/944,756

(22) Filed: Jul. 31, 2020

(65) Prior Publication Data

US 2022/0037341 A1 Feb. 3, 2022

(51) Int. Cl.
| | | |
|---|---|---|
| *H01L 23/52* | (2006.01) | |
| *H01L 21/82* | (2006.01) | |
| *H10B 20/20* | (2023.01) | |
| *H01L 23/525* | (2006.01) | |
| *G11C 17/16* | (2006.01) | |

(52) U.S. Cl.
CPC ............ *H10B 20/20* (2023.02); *G11C 17/16* (2013.01); *H01L 23/5252* (2013.01)

(58) Field of Classification Search
CPC ............ H01L 23/5252; H01L 27/0886; H01L 27/0924; H01L 27/1211; H01L 27/11206; G11C 17/16; G11C 17/18; H10B 20/00; H10B 20/20; H10B 20/50
See application file for complete search history.

(56) References Cited

U.S. PATENT DOCUMENTS

| | | | |
|---|---|---|---|
| 6,580,145 B2 | 6/2003 | Wu | |
| 6,649,456 B1 | 11/2003 | Liaw | |
| 6,972,450 B2 | 12/2005 | Liaw | |
| 7,364,961 B2 | 4/2008 | Liaw | |
| 9,773,792 B1 | 9/2017 | Liaw | |
| 2008/0007986 A1* | 1/2008 | Jeong | ............ G11C 17/165 365/96 |
| 2008/0170432 A1* | 7/2008 | Asao | ............ G11C 11/16 365/171 |
| 2010/0232203 A1 | 9/2010 | Chung | |
| 2016/0141049 A1* | 5/2016 | Song | ............ G11C 17/16 365/51 |
| 2020/0135746 A1* | 4/2020 | Liaw | ............ H01L 23/5226 |

* cited by examiner

*Primary Examiner* — Brook Kebede
(74) *Attorney, Agent, or Firm* — HAYNES AND BOONE, LLP

(57) ABSTRACT

A semiconductor structure includes first and second transistors each having a source terminal, a drain terminal, and a gate terminal. The semiconductor structure further includes a program line; a first metal plate over the first and the second transistors; a first insulator over the first metal plate; a second metal plate over the first insulator; a second insulator over the second metal plate; and a third metal plate over the second insulator. The first metal plate, the first insulator, and the second metal plate form a first anti-fuse element. The second metal plate, the second insulator, and the third metal plate form a second anti-fuse element. The source terminal of the first transistor is electrically connected to the first metal plate. The source terminal of the second transistor is electrically connected to the third metal plate. The program line is electrically connected to the second metal plate.

20 Claims, 24 Drawing Sheets

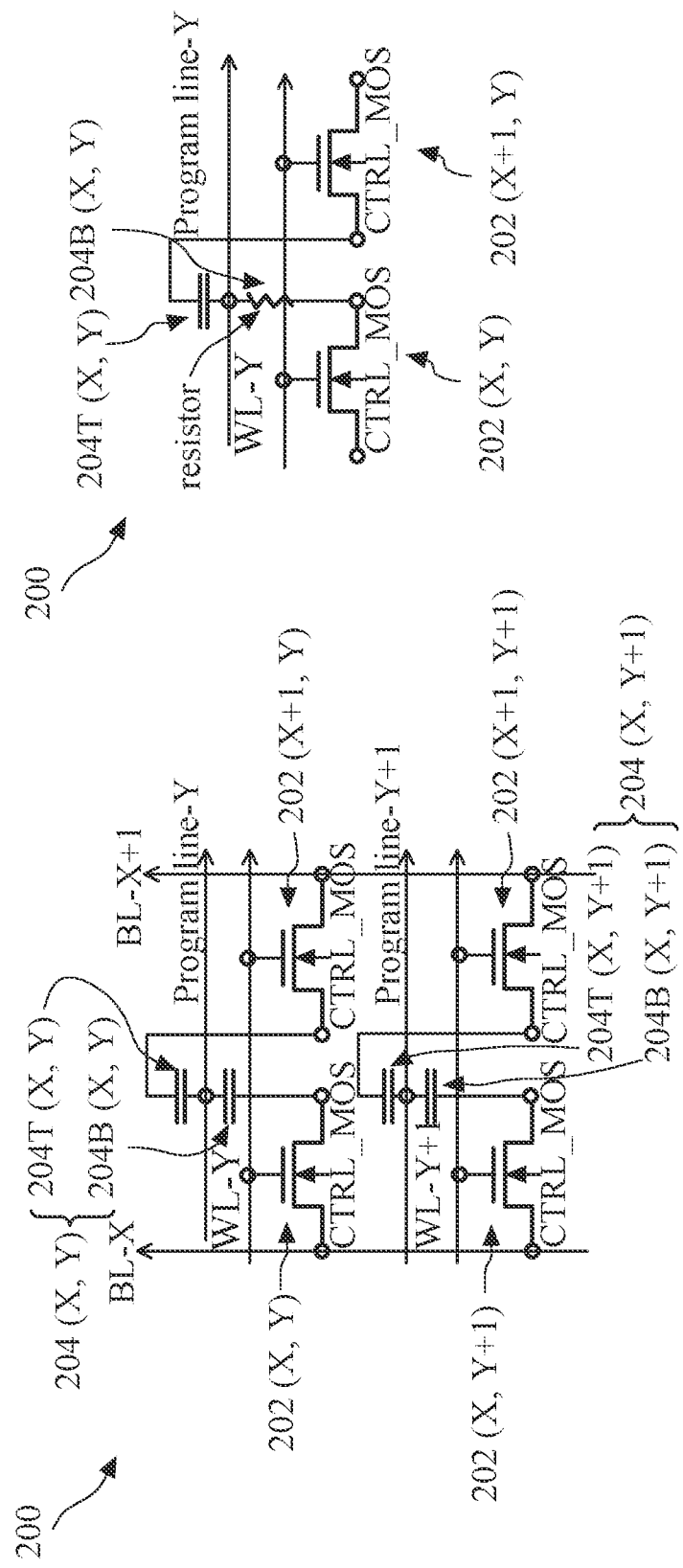

Anti-Fuse array: Operation

| | WL (selected) | WL (non-selected) | Program line (selected) | Program line (non-selected) | BL (selected) | BL (non-selected) |
|---|---|---|---|---|---|---|
| Programming cycle | 1/4~1/2 of V_P | 0 or predetermined V | V_P | 0 or predetermined V | 0V | 1/4~1/2 of V_P |
| Read cycle | <= V_R | 0V | V_P | 0 or predetermined V | Pre-state: 0V and electrically to SA | 0V, or floating or predetermined voltage |

FIG. 1C

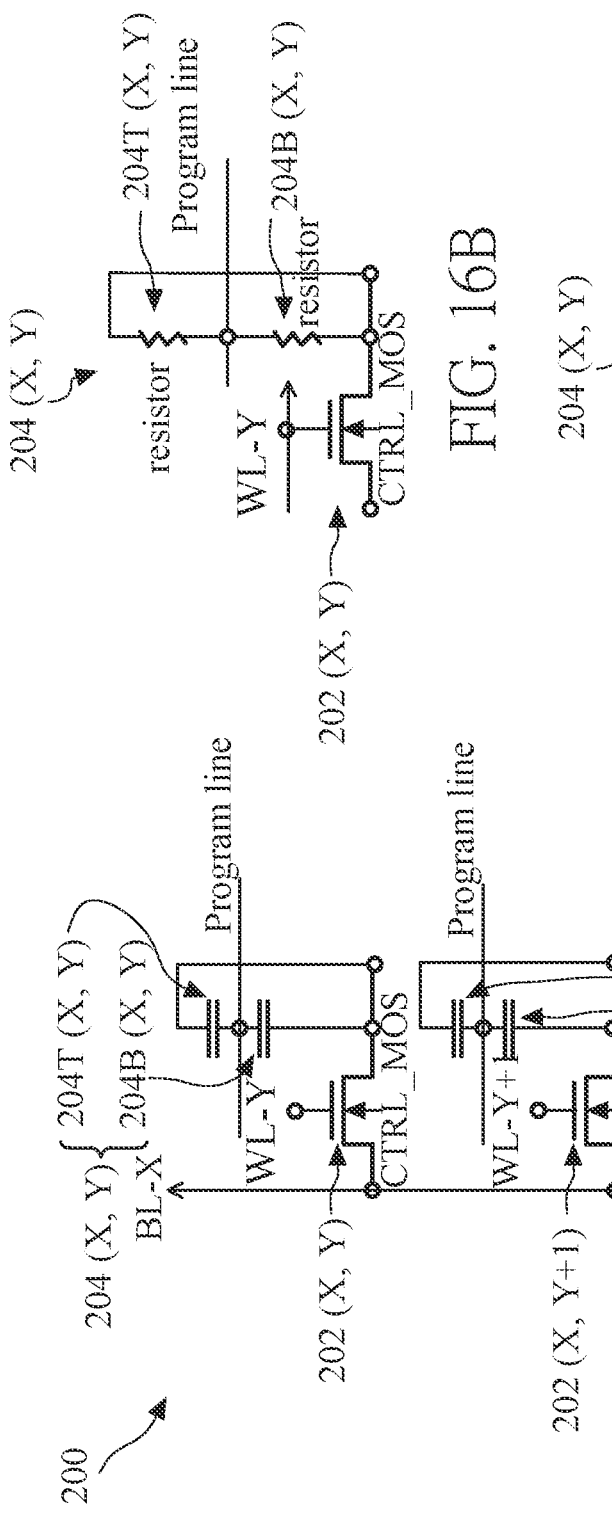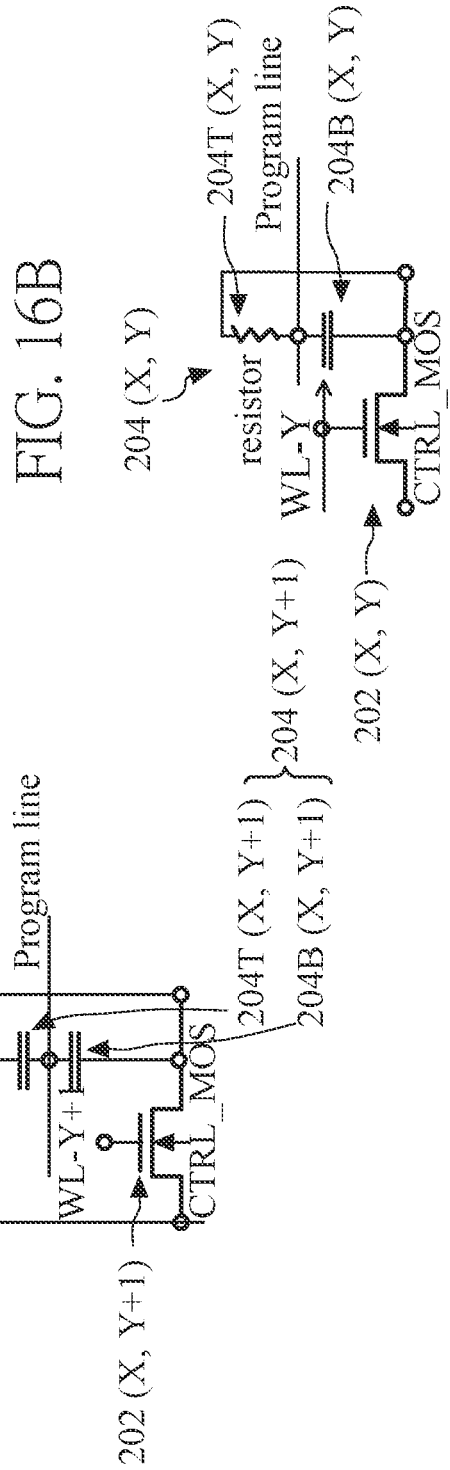
FIG. 16A
FIG. 16B
FIG. 16C

FUSE CELL STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, anti-fuses have been used in ICs. An anti-fuse is a fuse that is normally open (i.e., two terminals of the fuse are open circuit or high impedance). After being programmed, the two terminals of the fuse are electrically shorted allowing a current to flow between the two terminals. Anti-fuses have been implemented using transistors and their breakdown path are usually from the transistors' gate to either the transistors' channel or the transistors' drain. As ICs continue to scale down, the reliability, operation margin, and resistance variation of such anti-fuses become a concern.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A, 1B, 16A, 16B, 16C, and 17 illustrate schematic views of a fuse array of the present disclosure, according to some embodiments.

FIG. 1C illustrate certain operations of a fuse array of the present disclosure, according to an embodiment.

DETAILED DESCRIPTION

Figure 2:
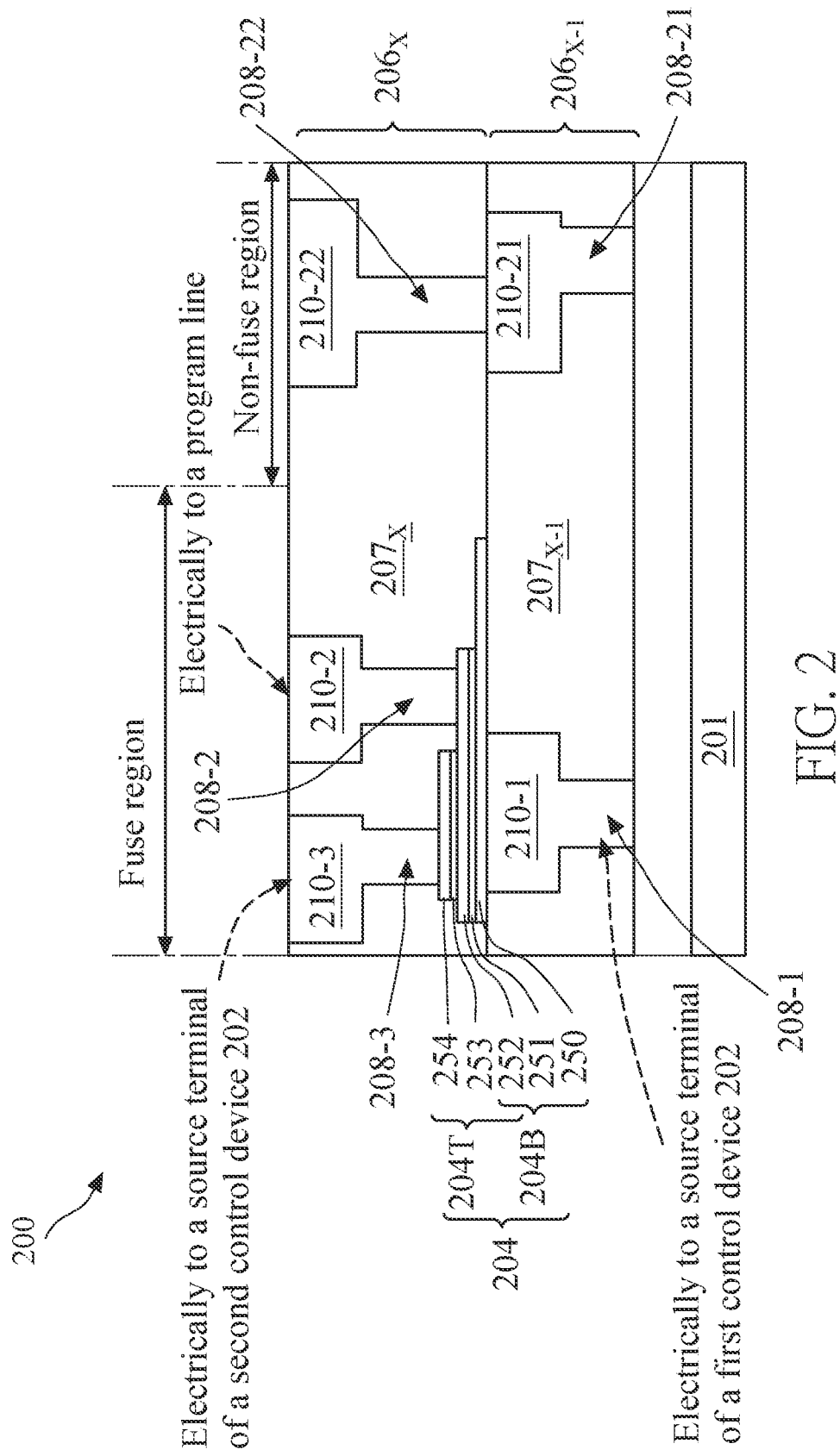
FIGS. 2, 3, 6, 7, 9, 10, 11, 13, 14, 15, 18, 20, and 21 show cross-sectional views of a portion of a fuse array, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices. More particularly, the present disclosure is related to semiconductor devices having anti-fuses (or anti-fuse elements) integrated therewith. In the present disclosure, the terms anti-fuse and fuse are used interchangeably. Traditionally, anti-fuses are implemented using transistors and their breakdown paths are usually from the transistors' gate to either the transistors' channel or the transistors' drain. However, such anti-fuses may be adversely affected by the down-scaling of the transistors. For example, the reliability and operation margin of such anti-fuses might be impacted in certain designs when transistors become smaller or become three-dimensional such as in FinFET or gate-all-around devices. Also, process changes implemented at front end of line (FEOL) and middle end of line (MEOL) processes sometime adversely affect the performance of anti-fuses. An object of the present disclosure is to overcome such issues. Particularly, the present disclosure provides a new type of anti-fuse, one that is implemented at metal layers and above the transistors. In an embodiment of the present disclosure, one fuse structure provides two fuse cells with vertically stacked fuse elements for cell size reduction, and both terminals of each fuse element are metal plates. Once programmed, the resistance between the terminals in the new fuses becomes very small (between metal and metal), which is much smaller than traditional fuses where silicon channel is in the conducting path and has a higher resistance than metals. As a result, the new fuse's read current is higher than traditional fuses. In some embodiments of the present disclosure, one fuse cell has two parallelly connected fuse elements, which improves the reliability of its programmability. Since the new type of fuses are implemented at the metal layers, the tuning of transistors and the fuses can be de-coupled, giving more freedom to tune the program voltage of the fuses. These and other aspects of the new type of fuses are further discussed below in conjunction with FIGS. 1A through 24, which illustrate schematic, operational, cross-sectional, and/or layout views of a semiconductor device 200, in accordance with some embodiments.

In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs or MOS FETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device 200 includes a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 1A-24 have been simplified for the sake of clarity to better understand the inventive concepts of the present disclosure. Additional features can be added in the device 200, and some of the features described below can be replaced, modified, or eliminated in other embodiments of the device 200.

FIG. 1A shows a schematic view of the device 200 having a fuse array with 4 fuse cells (a 2×2 array) constructed according to the present disclosure. Each fuse cell includes a control device 202 and a fuse element 204T or 204B. The fuse cells are connected to word lines WL and bit lines BL. In the fuse array in FIG. 1A, there are four control devices 202 that are arranged in rows and columns and denoted with their X (column) and Y (rows) coordinates, namely 202(X, Y), 202(X+1, Y), 202(X, Y+1), and 202(X+1, Y+1). For example, each of X and Y may be 0 or any positive integer. The fuse array in FIG. 1A may be part of a larger fuse array in the device 200. Each control device 202 has a gate terminal, a source terminal, and a drain terminal. The gate terminals of the control devices 202 in the same row are connected to the same word line. For example, the gate terminals of the control devices 202(X, Y) and 202(X+1, Y) are connected to the same word line WL-Y, and the gate terminals of the control devices 202(X, Y+1) and 202(X+1, Y+1) are connected to the same word line WL-Y+1. The drain terminals of the control devices 202 in the same column are connected to the same bit line. For example, the drain terminals of the control devices 202(X, Y) and 202(X, Y+1) are connected to the same bit line BL-X, and the drain terminals of the control devices 202(X+1, Y) and 202(X+1, Y+1) are connected to the same bit line BL-X+1. The source terminals of the control devices 202 are connected to the fuse elements 204 as will be further described below. The control devices 202 are NMOSFETs in the embodiment depicted in FIG. 1A. Alternatively, the control devices 202 can be PMOSFETs.

In the fuse array of FIG. 1A, there are four fuse elements (as two pairs), namely 204T(X, Y), 204B(X, Y), 204T(X, Y+1), and 204B(X, Y+1). As will be further described below (such as shown in FIG. 2), the fuse element 204T(X, Y) is vertically stacked atop of the fuse element 204B(X,Y) to form a pair of fuse elements denoted as 204(X, Y), and the fuse element 204T(X, Y+1) is vertically stacked atop of the fuse element 204B(X,Y+1) to form another pair of fuse elements denoted as 204(X, Y+1). Two adjacent control devices 202 in the same row share one pair of fuse elements 204. Each fuse element 204T or 204B has two terminals. One of the terminals is connected to the source terminal of the associated control device 202 and another terminal is connected to a program line. There are two program lines "Program line-Y" and "Program line-Y+1" shown in FIG. 1A. Each control device 202 can be selected by setting the associated bit line and word line to certain voltages. The program line can be set to certain voltages for certain duration such that the associated fuse element 204 can be programmed.

In the example shown in FIG. 1B, the control device 202(X, Y) is selected and the Program line-Y is utilized to program the fuse element 204B(X, Y). Once programmed, the two terminals of the fuse element 204B(X, Y) are shorted and the fuse element 204B(X, Y) becomes a low resistance path (such as a low resistance resistor) connecting the Program line-Y to the source terminal of the control device 202(X, Y). In the example shown in FIG. 1B, the fuse element 204T(X, Y) is not programmed and remains as an open circuit (or a high resistance path).

FIG. 1C illustrates the operation of the fuse array of the present disclosure according to an embodiment where the control devices 202 are NMOS FETs. The word lines, bit lines, and program lines are set to certain voltages for programming or reading the fuse elements 204. To program a fuse element, the selected (or associated) program line is set to a high voltage V_P (for example, V_P is higher than 2.5V in an embodiment), the selected word line is set to a voltage about a quarter (¼) to one half (½) of V_P to turn on the associated control device 202, and the selected bit line is set to a low voltage such as 0V. At the same time, the non-selected program lines and word lines are set to a low voltage (for example, 0V or another predetermined low voltage in an embodiment), and the non-selected bit lines are set to a voltage about a quarter (¼) to one half (½) of V_P. Particularly, the fuse element 204B(X, Y) is associated with (or can be selected with) the Program line-Y, the word line WL-Y, and the bit line BL-X; the fuse element 204T(X, Y) is associated with the Program line-Y, the word line WL-Y, and the bit line BL-X+1; the fuse element 204B(X, Y+1) is associated with the Program line-Y+1, the word line WL-Y+1, and the bit line BL-X; and the fuse element 204T(X, Y+1) is associated with the Program line-Y+1, the word line WL-Y+1, and the bit line BL-X+1.

For example, to program the fuse element 204B(X, Y), the Program line-Y is set to a high voltage V_P, the word line WL-Y is set to a voltage about a quarter (¼) to one half (½) of V_P, the bit line BL-X is set to a low voltage such as 0V, the Program line-Y+1 and the word line WL-Y+1 are set to a low voltage, and the bit line BL-X+1 is set to a voltage about a quarter (¼) to one half (½) of V_P.

To read a fuse element, the selected program line is set to a voltage V_R (for example, V_R is 0.75V in an embodiment and can be in a range of 0.6V to 1.2V in various embodiments), the selected word line is set to a voltage less than or equal to V_R, and the selected bit line is sensed (e.g., by a sense amplifier) to detect the impedance of the fuse element. At the same time, the non-selected program lines and word lines are set to a low voltage (for example, 0V or another predetermined low voltage in an embodiment), and the non-selected bit lines are set to 0V, a predetermined low voltage, or left floating. For example, to read the fuse element 204B(X, Y), the Program line-Y is set to a high voltage V_R, the word line WL-Y is set to a voltage less than or equal to V_R, the Program line-Y+1 and the word line WL-Y+1 are set to a low voltage, and the bit line BL-X is sensed to detect the impedance of the fuse element 204B(X, Y). If a fuse element is sensed or detected as having a low impedance, the fuse element has been shorted (or successfully programmed). Conversely, if a fuse element is detected as having a high impedance, the fuse element has not been programmed or has failed to be programmed.

In embodiments where the control devices 202 are PMOS FETs, the voltages applied to the word lines and bit lines in FIG. 1C are adjusted for PMOS operations. For example, to program a fuse element in such embodiments, the selected program line is set to a high voltage V_P (for example, V_P is higher than 2.5V in an embodiment), the selected word line is set to a low voltage such as 0V or another predetermined low voltage to turn on the selected control device 202, and the associated bit line is set to a voltage about a quarter (¼) to one half (½) of V_P. At the same time, the non-selected program lines and bit lines are set to a low voltage (for example, 0V or another predetermined low voltage in an embodiment), and the non-selected word lines are set to a voltage about a quarter (¼) to one half (½) of V_P. For example, to read a fuse element in such embodiments, the selected program line is set to a high voltage V_R (for example, V_R is 0.75V in an embodiment and can be in a range of 0.6V to 1.2V in various embodiments), the selected word line is set to a low voltage such as 0V or another predetermined low voltage, and the selected bit line is sensed (e.g., by a sense amplifier) to detect the impedance of the fuse element. At the same time, the non-selected program lines are set to a low voltage (for example, 0V or another predetermined low voltage in an embodiment), the non-selected word lines are set to a high voltage V_R, and the non-selected bit lines are set to 0V, a predetermined low voltage, or left floating.

FIG. 2 shows a cross-sectional view of the device 200, particularly a pair of fuse elements 204T and 204B (collectively denoted as 204). The pair of fuse elements 204T and 204B are implemented as three metal plates 250, 252, and 254 separated by two insulators 251 and 253. Particularly, the fuse element 204B includes the metal plates 250 and 252 separated by the insulator 251, and the fuse element 204T includes the metal plates 252 and 254 separated by the insulator 253. The metal plate 252 is shared by the two fuse elements 204B and 204T. By stacking the fuse elements 204B and 204T vertically one over another, the present disclosure improves the fuse cell density.

The pair of fuse elements 204 are located in a metal interconnect layer $206_x$, such as Metal 4 (or M4) layer (where x=4), Metal 5 (or M5) layer (where x=5), or another metal interconnect layer. In the following discussion, a metal interconnect layer and an interconnect layer are used interchangeably. In some embodiments, the pair of fuse elements 204 are located in an interconnect layer $206_x$ that is higher than the Metal 3 (or M3) layer such that part of the routing to/from the fuse elements 204 can be achieved using the interconnect layers underneath, such as Metal 1 (or M1) layer, Metal 2 (or M2) layer, and Metal 3 (or M3) layer. The interconnect layer $206_x$ includes one or more dielectric layers $207_x$ and metal lines 210 (such as metal lines 210-2 and 210-3) and vias 208 (such as vias 208-2 and 208-3) embedded in the dielectric layer(s) $207_x$. The fuse elements 204 are also embedded in the dielectric layer(s) $207_x$ and are connected to the metal lines and the vias. In the depicted embodiment, the interconnect layer $206_x$ is disposed over another interconnect layer $206_{x-1}$. For example, if the interconnect layer $206_x$ is the M4 layer (i.e., x=4), then the interconnect layer $206_{x-1}$ is the M3 layer. Similar to the interconnect layer $206_x$, the interconnect layer $206_{x-1}$ includes one or more dielectric layers $207_{x-1}$ and metal lines 210 (such as metal lines 210-1) and vias 208 (such as vias 208-1) embedded in the dielectric layer(s) $207_{x-1}$. The interconnect layers $206_x$ and $206_{x-1}$ are disposed over a substrate 201. The device 200 may further include one or more interconnect layers between the interconnect layer $206_{x-1}$ and the substrate 201 in various embodiments. In some embodiments, the device 200 further includes one or more interconnect layers above the interconnect layer $206_x$. Further, the device 200 may include source/drain contacts, gate contacts, source/drain contact vias, gate contact vias for providing electrical connectivity to various transistors and other devices in the substrate 201.

In embodiments, the substrate 201 includes a silicon (Si) substrate, such as a silicon wafer. Alternatively, the substrate 201 may comprise another semiconductor, such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP); or combinations thereof. In yet another alternative, the substrate 201 includes a semiconductor on insulator (SOI) substrate.

The substrate 201 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs, nanowire FETs, and nanosheet FETs. The transistors generally include source/drain terminals and gate terminals. The substrate 201 may further include passive devices such as resistors, capacitors, and inductors. For example, the control devices 202 (FIG. 1A) are implemented in or on the substrate 201, and each control device 202 may be a planar transistor or a multi-gate transistor in some embodiments.

The substrate 201 also includes one or more isolation structures for isolating the various transistors, resistors, capacitors, and inductors. The isolation structures may include shallow trench isolation, deep trench isolation, field oxide, LOCal Oxidation of Silicon (LOCOS), or other suitable structure; and may include silicon oxide ($SiO_2$), silicon nitride ($Si_3N_4$), silicon oxynitride (SiON), fluoride-doped silicate glass (FSG), a low-k dielectric material, and/or other suitable insulating material. The substrate 201 may also include one or more dielectric layers over the various transistors, resistors, capacitors, and inductors. For example, the one or more dielectric layers may include silicon nitride ($Si_3N_4$), silicon oxynitride (SiON), silicon nitride with oxygen (O) or carbon (C) elements, doped or undoped silicate glass, silicon oxide, and/or other materials.

In embodiments, the dielectric layers $207_x$ and $207_{x-1}$ may have the same or similar composition and include materials such as tetraethylorthosilicate (TEOS) oxide, un-doped silicate glass, or doped silicon oxide such as borophosphosilicate glass (BPSG), fluoride doped silica glass (FSG), phosphosilicate glass (PSG), boron doped silica glass (BSG), and/or other suitable dielectric materials. The dielectric layers $207_x$ and $207_{x-1}$ may be deposited by a plasma enhanced chemical vapor deposition (PECVD) process, a flowable chemical vapor deposition (FCVD) process, or other suitable deposition technique.

Each via 208 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the via 208.

Each metal line 210 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Similar to the vias 208, the metal lines 210 may further include a conductive barrier layer in some embodiments and the conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof. The metal lines 210 and the vias 208 may be formed using a damascene process, a dual-damascene process, a metal patterning process, or other suitable processes.

Still referring to FIG. 2, each of the metal plates 250, 252, and 254 includes a titanium nitride (TiN) based metal or metal compound in an embodiment. Alternatively, each of the metal plates 250, 252, and 254 includes a single metal or a stack of multiple metals where the metal or metals is/are selected from the group consisting of Ti, TiN, Ni, Mo, Pt, Co, Ru, W, TaN, Cu, or a combination thereof. Each of the metal plates 250, 252, and 254 may be formed by CVD, PVD, ALD, plating, or other suitable processes. In some embodiments, the bottom metal plate 250 and the top metal plate 254 each have a thickness less than 200 Å, such as in a range of about 30 Å to about 200 Å. In some embodiments, the middle metal plate 252 has a thickness in a range of about 30 Å to about 200 Å. The top metal plate 254 is smaller than the middle metal plate 252 and the bottom metal plate 250 in the present embodiment. The portion of the middle metal plate 252 and the bottom metal plate 250 that extend beyond the top metal plate 254 provides a landing area for a via 208-2.

Each of the insulators 251 and 253 includes a single dielectric material or a stack of multiple dielectric materials. In some embodiments, each of the insulators 251 and 253 includes a material selected from the group consisting of $SiO_2$, SiOC, SiON, SiOCN, $Si_3N_4$, carbon doped $SiO_2$, nitrogen doped $SiO_2$, carbon and nitrogen doped $SiO_2$, $HfO_2$, $Ta_2O_5$, $TiO_2$, $ZrO_2$, $Al_2O_3$, $Y_2O_3$, or a combination thereof. Each of the insulators 251 and 253 may be deposited using CVD, ALD, or other suitable methods. In some embodiments, each of the insulators 251 and 253 has a thickness in a range of about 5 Å to about 50 Å. Such thickness is designed by taking into account the voltage that is required to break down the insulators 251 and 253 when programming the fuse elements 204. If the insulator 251 or 253 is too thick (such as more than 50 Å thick), then the voltage required to break down the insulators 251 and 253 may be too high for the device 200. If the insulator 251 or 253 is too thin (such as less than 5 Å thick), the operation of the fuse elements 204 may be unstable or unreliable. The various features of the fuse element 204 (including the metal plates 250, 252, and 254 and the insulators 251 and 253) may be formed by the deposition as described above and etching processes, such as dry etching, reactive ion etching, other suitable methods.

FIG. 2 further shows the physical and electrical connectivity between the fuse element 204 and other elements of the fuse array (such as the control devices 202 and the program line) according to an embodiment. In this embodiment, the bottom metal plate 250 is directly connected to a metal line 210-1 in the interconnect layer $206_{x-1}$. The metal line 210-1 is disposed on a via 208-1 which is electrically connected to the source terminal of a control device 202, such as the control device 202(X, Y) or 202(X, Y+1) that is implemented in or on the substrate 201. Although not shown in FIG. 2, the via 208-1 and the source terminal of the control device 202 are connected through metal features such as metal lines, vias, and contacts. The middle metal plate 252 is directly connected to a via 208-2 in the interconnect layer $206_x$. The via 208-2 is disposed under and connected to a metal line 210-2 in the interconnect layer $206_x$ which is electrically connected to the program line. Although not shown in FIG. 2, the metal line 210-2 and the program line are connected through metal features such as metal lines and vias. The top metal plate 254 is directly connected to a via 208-3 in the interconnect layer $206_x$. The via 208-3 is disposed under and connected to a metal line 210-3 in the interconnect layer $206_x$ which is electrically connected to the source terminal of another control device 202, such as the control device 202(X+1, Y) or 202(X+1, Y+1) that is implemented in or on the substrate 201. Although not shown in FIG. 2, the metal line 210-3 and the source terminal of the control device 202 are connected through metal features such as metal lines, vias, and contacts. Again, by vertically stacking the fuse elements 204T and 204B, the present disclosure provides fuse elements in a high density, yet each fuse element 204T and 204B can be individually and separately programmed, providing great design flexibility.

As discussed with reference to FIGS. 1A-1C, each of the fuse elements 204T an 204B can be programmed (shorted) by applying certain voltages for certain duration to the associated program line, word line, and bit line. When a fuse element is successfully programmed, the insulator 251 or 253 is broken down by the voltages applied to the metal plates that sandwich the respective insulator. For example, when the fuse element 204B is successfully programmed, the insulator 251 is broken down by the voltages applied to the metal plates 252 and 250 and becomes a low resistance path for current to flow through. Similarly, when the fuse element 204T is successfully programmed, the insulator 253 is broken down by the voltages applied to the metal plates 252 and 254 and becomes a low resistance path for current to flow through.

The fuse element 204, the vias 208-1, 208-2, and 208-3, and the metal lines 210-1, 210-2, and 210-3 are provided in a fuse region of the device 200. FIG. 2 also depicts metal lines and vias in a non-fuse region. These include a via 208-21 and a metal line 210-21 in the interconnect layer $206_{x-1}$ and a via 208-22 and a metal line 210-22 in the interconnect layer $206_x$. The via 208-22 is disposed on the metal line 210-21. The via 208-22 is taller (or longer) than the vias 208-2 and 208-3 in the fuse region that are directly landed on the metal plates 252 and 254, the metal lines 210-22, 210-2, and 210-3 have about the same thickness (vertical dimension).

Figure 3:
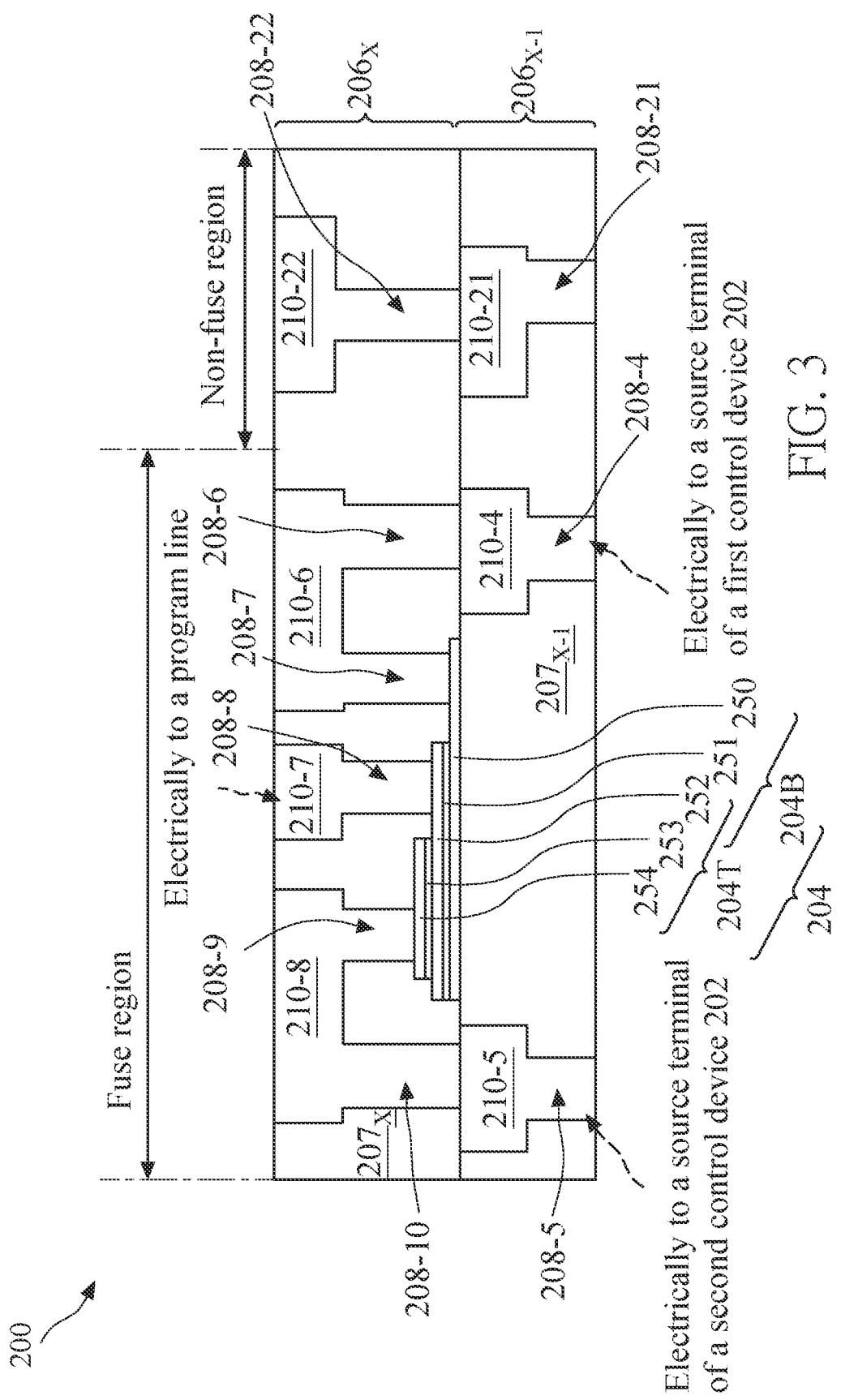

FIG. 3 shows the physical and electrical connectivity between the fuse element 204 and other elements of the fuse array (such as the control devices 202 and the program line) according to another embodiment. Many features of the embodiment in FIG. 3 are the same as the embodiment in FIG. 2, with like reference numerals denoting like features in the two figures. These common features include the interconnect layers $206_x$ and $206_{x-1}$, the dielectric layers $207_x$ and $207_{x-1}$, the vias 208, the metal lines 210, the metal plates 250, 252, and 254, and the insulators 251 and 253. For simplicity, descriptions of these features are not repeated. Also, the substrate 201 is not shown in FIG. 3 for simplicity.

As depicted in FIG. 3, the bottom plate 250 is not directly connected to metal lines or vias in the interconnect layer $206_{x-1}$. Instead, the bottom plate 250 is directly connected to a via 208-7 in the interconnect layer $206_x$ and then through a metal line 210-6 and a via 208-6 in the interconnect layer $206_x$ and a metal line 210-4 and a via 208-4 in the interconnect layer $206_{x-1}$ to the source terminal of a control device 202, such as the control device 202(X, Y) or 202(X, Y+1) that is implemented in or on the substrate 201. The connectivity between the top metal plate 254 and the source terminal of the second control device 202 is similar. In other words, the top metal plate 254 is directly connected to a via 208-9 in the interconnect layer $206_x$ and then through a metal line 210-8 and a via 208-10 in the interconnect layer $206_x$ and a metal line 210-5 and a via 208-5 in the interconnect layer $206_{x-1}$ to the source terminal of the second control device 202, such as the control device 202(X+1, Y) or 202(X+1, Y+1) that is implemented in or on the substrate 201. The middle metal plate 252 is directly connected to a via 208-8 in the interconnect layer $206_x$ and then through a metal line 210-7 in the interconnect layer $206_x$ to the program line. In the embodiment depicted in FIG. 3, all direct connection to the metal plates 250, 252, and 254 are in the same interconnect layer $206_x$. Further, the vias 208-7, 208-8, and 208-9 that are landed directly on the metal plates 250, 252, and 254 are shorter than the other vias that are not landed directly on the metal plates 250, 252, and 254 in the interconnect layer $206_x$. Further, the top metal plate 254 is smaller than the middle metal plate 252 that is in turn smaller than the bottom metal plate 250. The portion of the bottom metal plate 250 extending beyond the middle metal plate 252 provides a landing area for the via 208-7. The portion of the middle metal plate 252 extending beyond the top metal plate 254 provides a landing area for the via 208-8.

Figure 4:
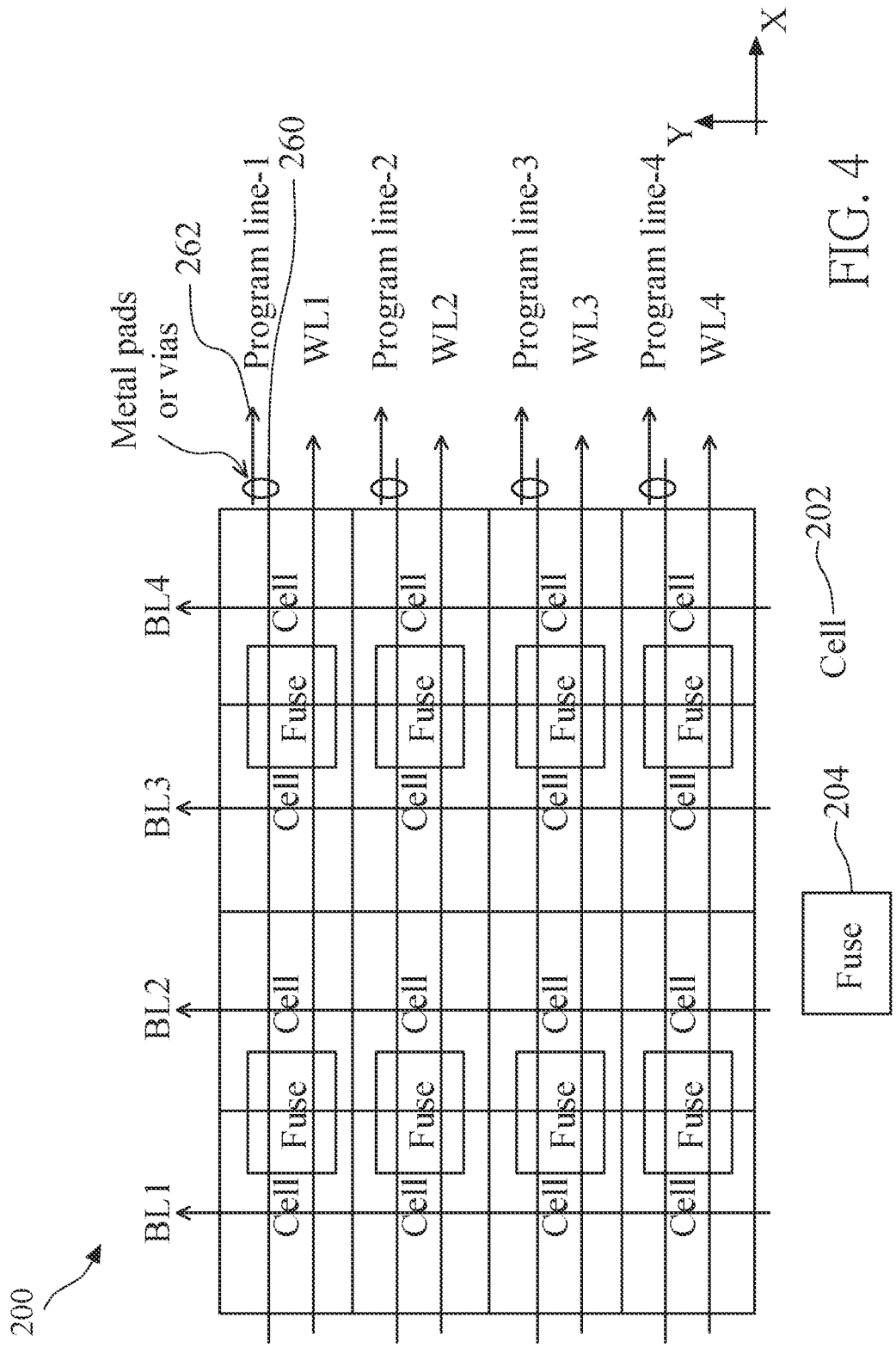
FIGS. 4 and 22 illustrate schematic views of certain routings of a fuse array, according to some embodiments.

FIG. 4 illustrates the routing of certain signal lines in an example fuse array in the device 200. In this example, the fuse array is a 4×4 array—having 4 control devices 202 per row and 4 control devices 202 per column. The control devices 202 are shown as "Cell" in this diagram. A pair of fuse elements 204 are shared by two adjacent Cells. Each pair of fuse elements 204 include a fuse element 204T vertically stacked atop another fuse element 204B as discussed with reference to FIGS. 2 and 3. There are four program lines for this example fuse array, Program line-1, 2, 3, 4. Each program line includes a signal line 260 that is routed in the same interconnect layer as where the fuse elements 204 are disposed (such as the interconnect layer $206_x$ in FIGS. 2 and 3). For this reason, the signal line 260 is also referred to as in-cell program line. For example, the signal line 260 may be the metal line 210-2 in FIG. 2 or the metal line 210-7 in FIG. 3. Each program line further includes a signal line 262 that is routed in an interconnect layer (such as the interconnect layer $206_{x-1}$ or a lower interconnect layer) below the interconnect layer where the fuse elements 204 are disposed (such as the interconnect layer $206_x$). The signal line 262 is eventually connected to a selector or driver circuit in the device 200. The signal lines 260 and 262 are connected through metal landing pads or vias (such as vias 208). The in-cell program lines 260 are routed horizontally in this example (along the "x" direction). In an embodiment, the in-cell program lines 260 are routed in an interconnect layer (i.e., the M4 or higher interconnect layer) that is above the third interconnect layer in the device 200. There are four word lines for this example fuse array, WL1, WL2, WL3, and WL4, which are routed horizontally (along the "x" direction). In an embodiment, these word lines are routed in the second interconnect layer above the transistors in the device 200 (i.e., the M2 interconnect layer). These word lines are eventually connected to selector or driver circuits in the device 200. There are four bit lines for this example fuse array, BL1, BL2, BL3, and BL4, which are routed vertically (along the "y" direction). In an embodiment, these bit lines are routed in the first interconnect layer above the transistors in the device 200 (i.e., the M1 interconnect layer). These bit lines are eventually connected to ground or sense amplifiers depending on the operation of the fuse array.

Figure 5:
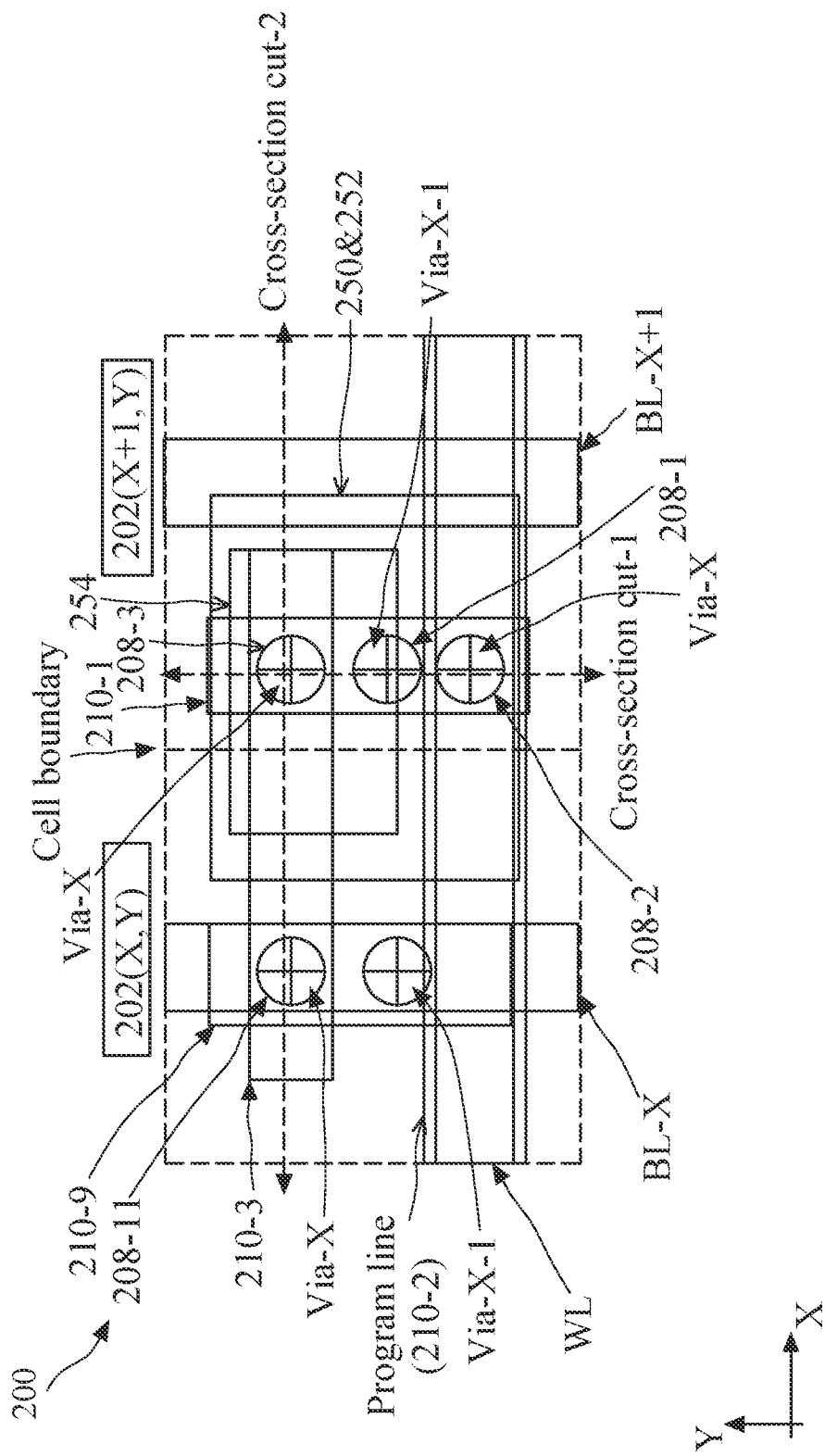
FIGS. 5, 8, 12, and 19 each illustrate a layout of a portion of a fuse array, according to some embodiments.

FIG. 5 illustrates a layout of a portion of the fuse array in FIG. 1A according to an embodiment. Particularly, FIG. 5 shows the layout of various metal features for the fuse element 204(X, Y). The underlying control devices 202(X, Y) and 202(X+1, Y) are indicated with dashed boxes that share a boundary ("Cell boundary"). FIG. 5 shows that from the top view, the metal plates 250 and 252 have the same size and shape and fully overlap with each other (i.e., they are coextensive), while the top metal plate 254 is smaller than the metal plates 250 and 252 and is enclosed by the metal plates 250 and 252. There is some clearance from the edges of the top metal plate 254 to the edges of the metal plates 252 and 250. The bit lines BL-X and BL-X+1 are routed vertically (along the "y" direction). The (in-cell) program line and the word line WL are routed horizontally (along the "x" direction). In an embodiment, the bit lines BL-X and BL-X+1 are routed in the M1 interconnect layer, the word line WL is routed in the M2 interconnect layer (i.e., the interconnect layer directly above the M1 interconnect layer), while the (in-cell) program line 210-2 is routed in an interconnect layer that is the M4 or higher interconnect layer (i.e., M4 layer, M5 layer, and so on).

Figures 6, 7:
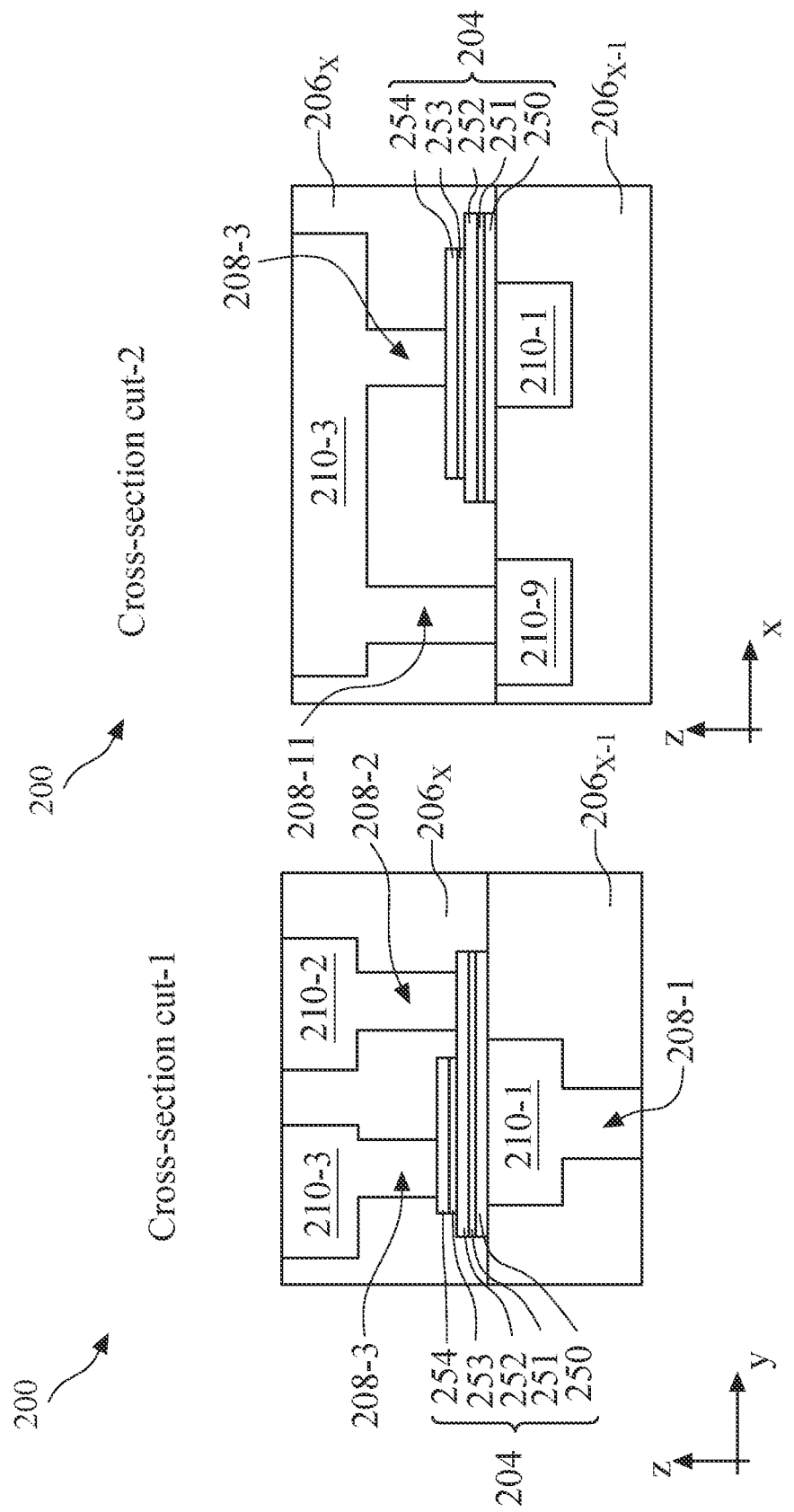

FIGS. 6 and 7 are cross-sectional views of the device 200 along the "Cross-section cut-1" line and the "Cross-section cut-2" line in FIG. 5, respectively. The features in FIG. 6 are the same as those in FIG. 2 in the fuse region, the descriptions of which are omitted for simplicity. Some of the features in FIG. 7, including the fuse element 204, the metal lines 210-1 and 210-3, and the via 208-3 are the same as those in FIG. 2 in the fuse region. FIG. 7 further illustrates that the metal line 210-3 is connected to a via 208-11 in the interconnect layer $206_x$ and the via 208-11 is disposed on the metal line 210-9 in the interconnect layer $206_{x-1}$.

Figure 8:
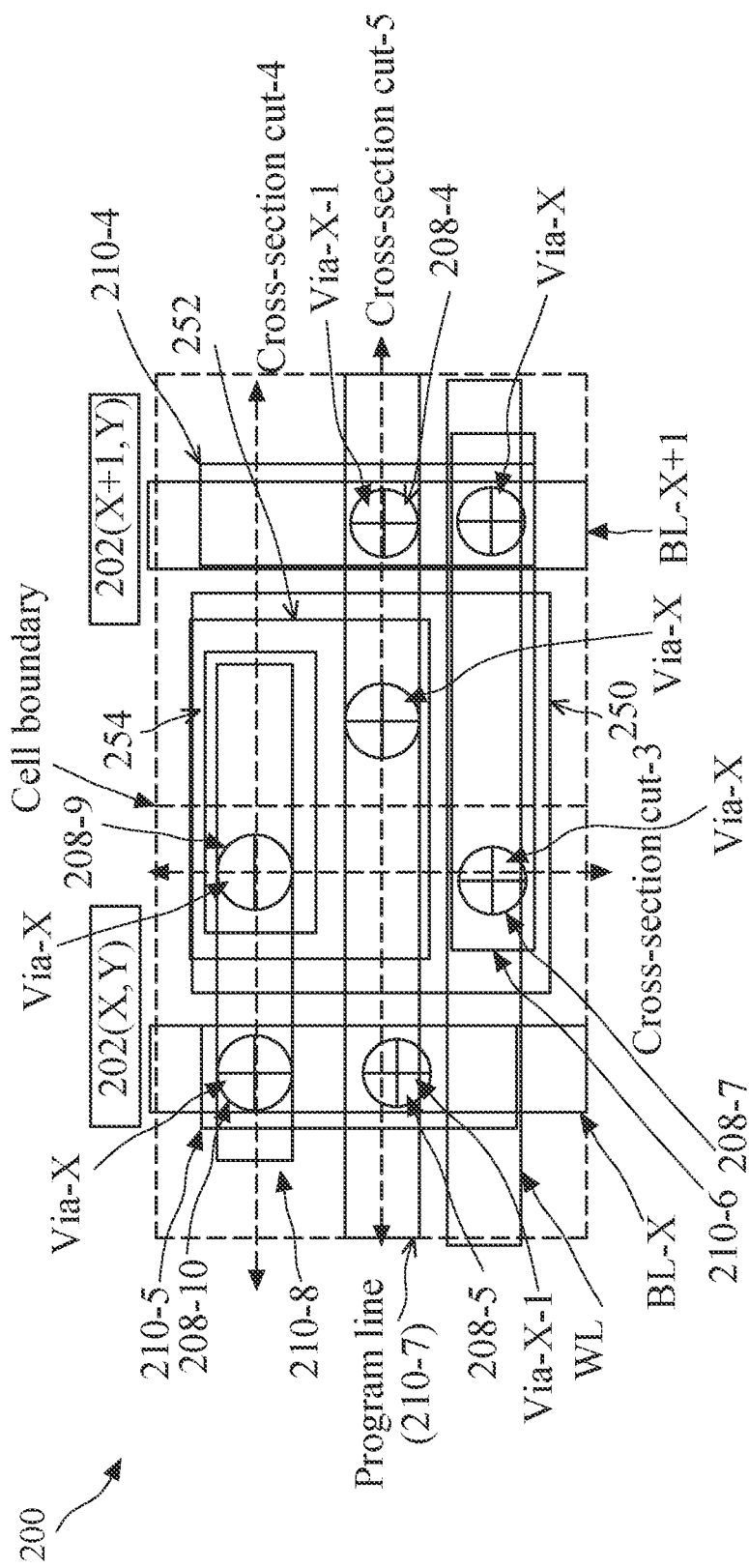
Figure 9:
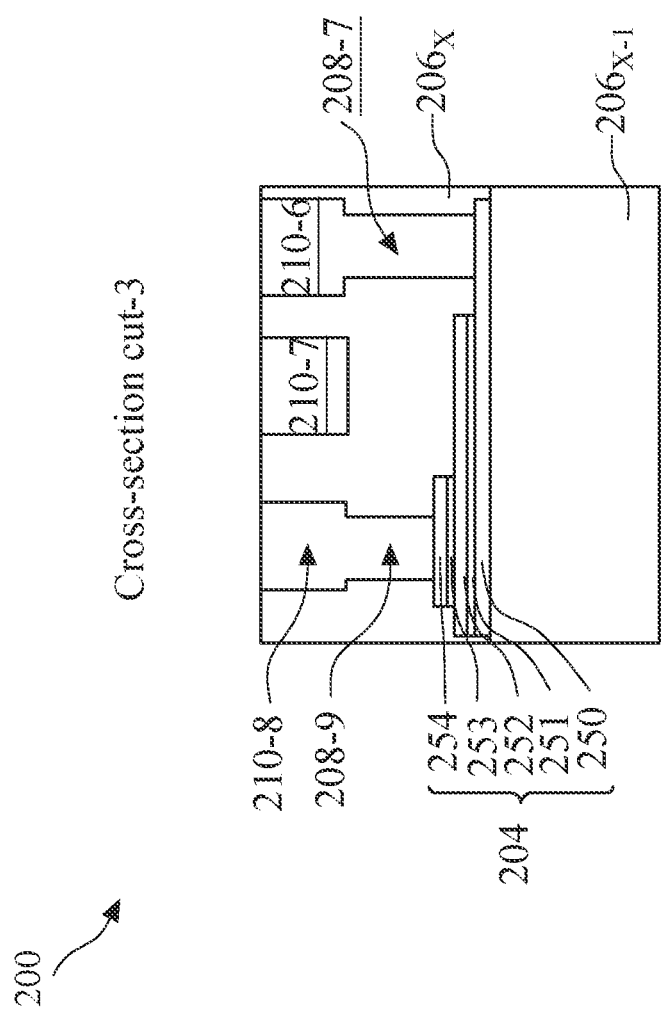

FIG. 8 illustrates a layout of a portion of the fuse array in FIG. 1A according to another embodiment. Particularly, FIG. 8 shows the layout of various metal features for the fuse element 204(X, Y). The underlying control devices 202(X, Y) and 202(X+1, Y) are indicated with dashed boxes that share a boundary ("Cell boundary"). FIG. 8 shows that from the top view, the bottom metal plate 250 is larger than the middle metal plate 252 which is larger than the top metal plate 254. The middle metal plate 252 is enclosed by the top metal plate 250 on three sides and shares one side with the metal plate 250 (see also FIG. 9 showing a side of the metal plate 252 vertically aligned with a side of the metal plate 250). The top metal plate 254 is fully enclosed by the middle metal plate 252. There is some clearance from the edges of the top metal plate 254 to the edges of the metal plates 252 and 250. The bit lines BL-X and BL-X+1 are routed vertically (along the "y" direction). The (in-cell) program line and the word line WL are routed horizontally (along the "x" direction). In an embodiment, the bit lines BL-X and BL-X+1 are routed in the M1 interconnect layer, the word line WL is routed in the M2 interconnect layer (i.e., the interconnect layer directly above the M1 interconnect layer), while the (in-cell) program line 210-7 is routed in an interconnect layer that is the M4 or higher interconnect layer (i.e., M4 layer, M5 layer, and so on).

Figure 10:
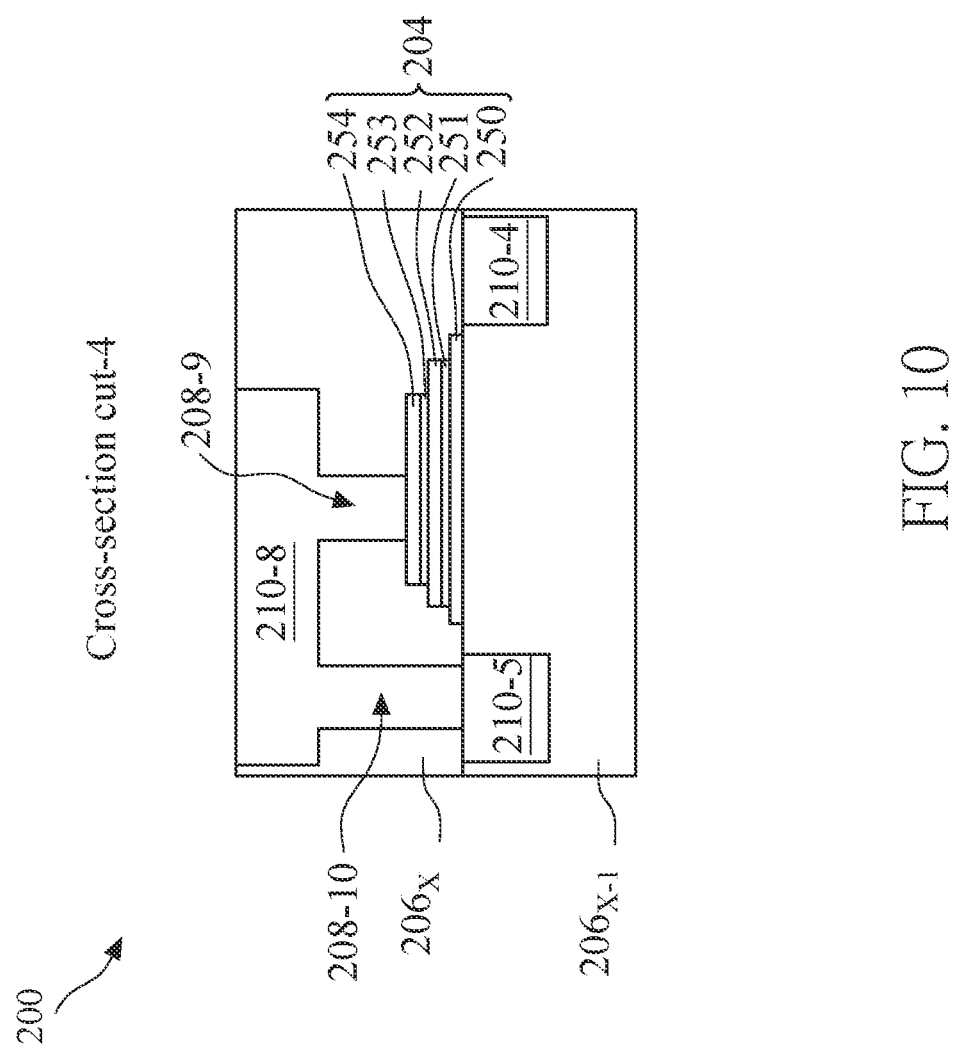
Figure 11:
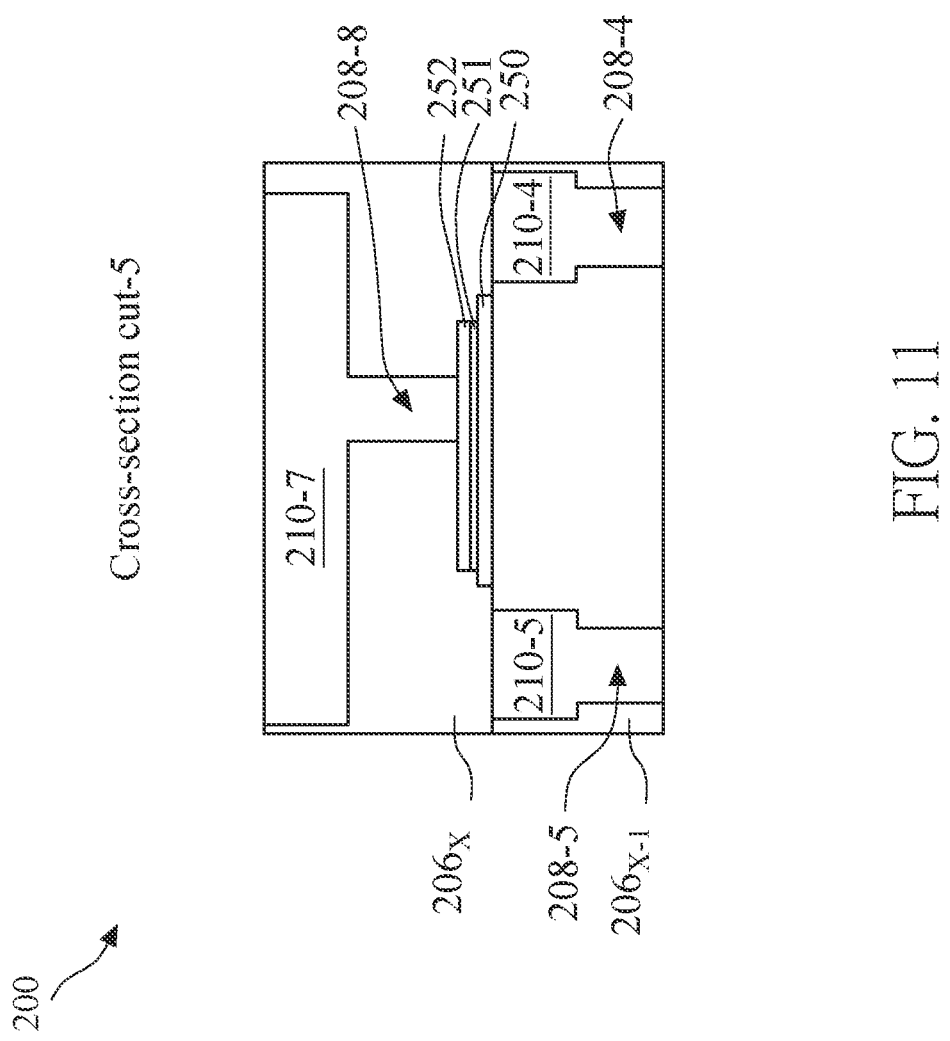

FIGS. 9, 10, and 11 are cross-sectional views of the device 200 along the "Cross-section cut-3" line, the "Cross-section cut-4" line, and the "Cross-section cut-5" line in FIG. 8, respectively. The features in FIGS. 9, 10, and 11 are the same as those in FIG. 3 in the fuse region, descriptions of which are omitted for simplicity.

Figure 12:
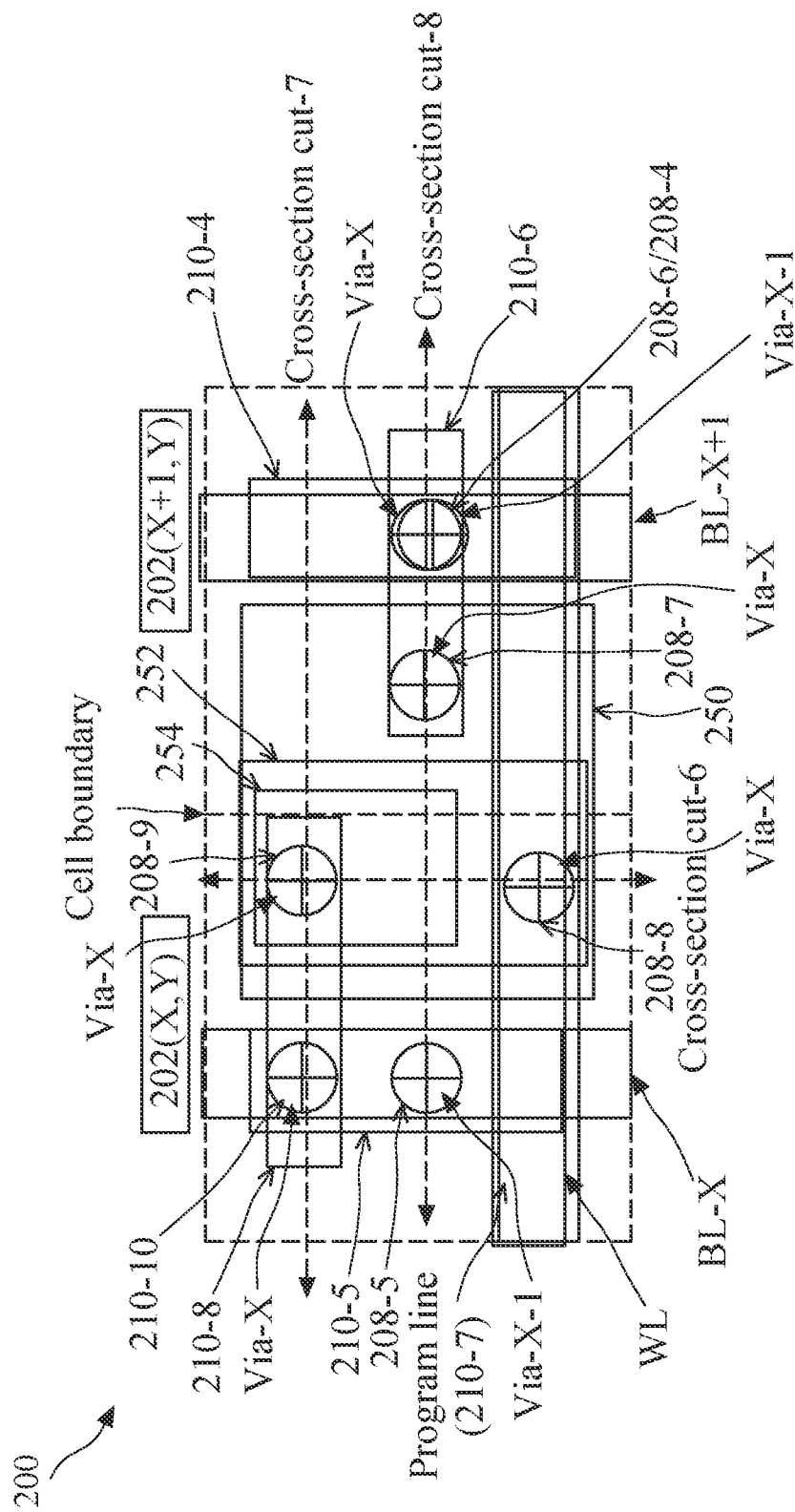
Figure 13:
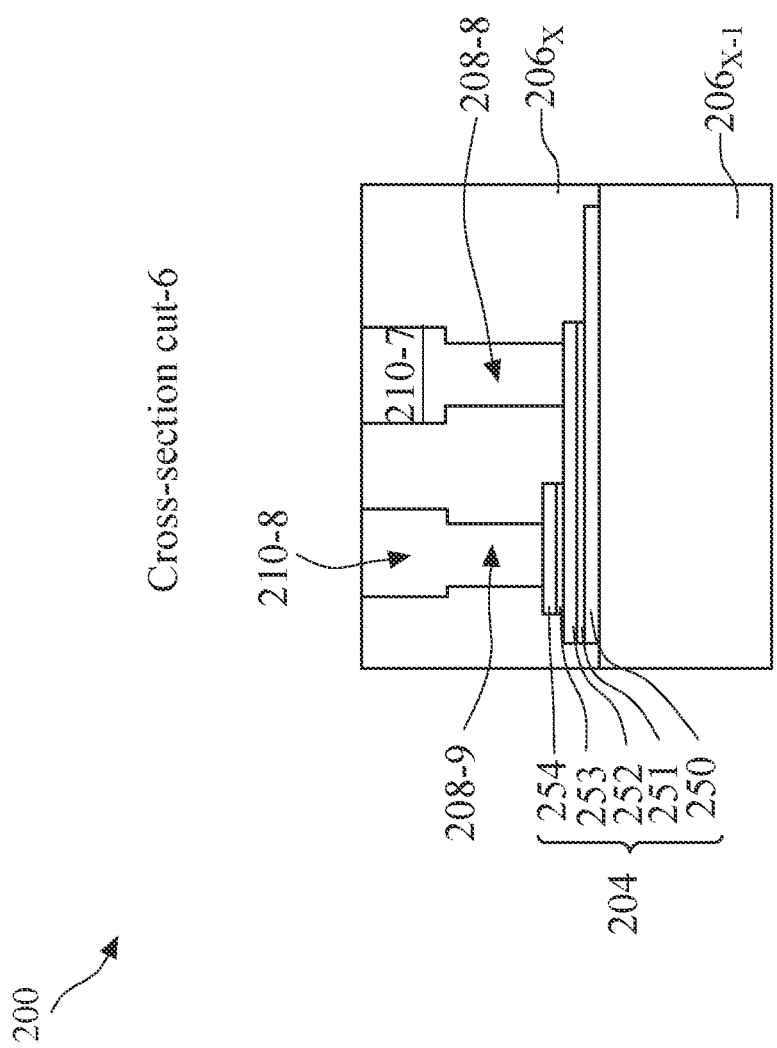

FIG. 12 illustrates a layout of a portion of the fuse array in FIG. 1A according to yet another embodiment. Particularly, FIG. 12 shows the layout of various metal features for the fuse element 204(X, Y). The underlying control devices 202(X, Y) and 202(X+1, Y) are indicated with dashed boxes that share a boundary ("Cell boundary"). FIG. 12 shows that from the top view, the bottom metal plate 250 is larger than the middle metal plate 252 which is larger than the top metal plate 254. The middle metal plate 252 is enclosed by the bottom metal plate 250 on three sides and shares one side with the bottom metal plate 250 (see also FIG. 13 showing a side of the metal plate 252 vertically aligned with a side of the metal plate 250). The top metal plate 254 is fully enclosed by the middle metal plate 252. There is some clearance from the edges of the top metal plate 254 to the edges of the metal plates 252 and 250. The bit lines BL-X and BL-X+1 are routed vertically (along the "y" direction). The (in-cell) program line and the word line WL are routed horizontally (along the "x") direction). In an embodiment, the bit lines BL-X and BL-X+1 are routed in the M1 interconnect layer, the word line WL is routed in the M2 interconnect layer (i.e., the interconnect layer directly above the M1 interconnect layer), while the (in-cell) program line 210-7 is routed in an interconnect layer that is the M4 or higher interconnect layer (i.e., M4 layer, M5 layer, and so on).

Figure 14:
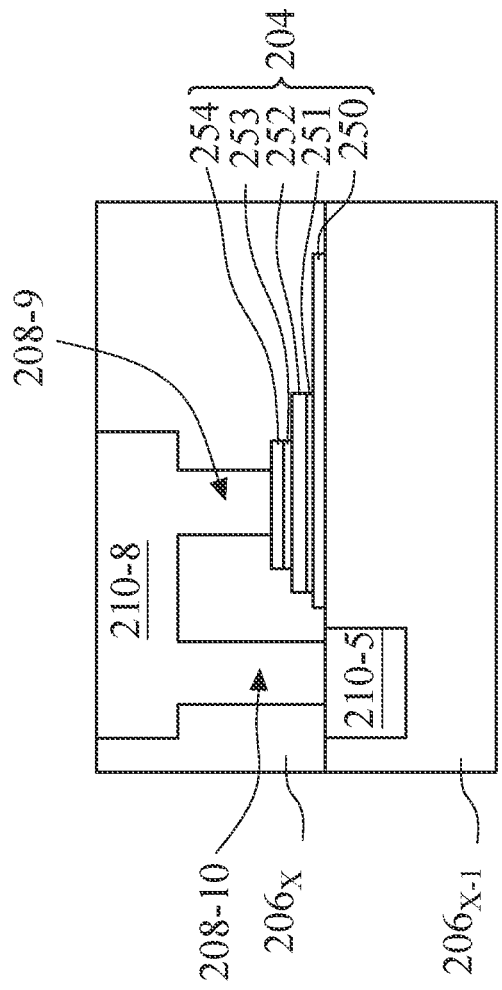
Figure 15:
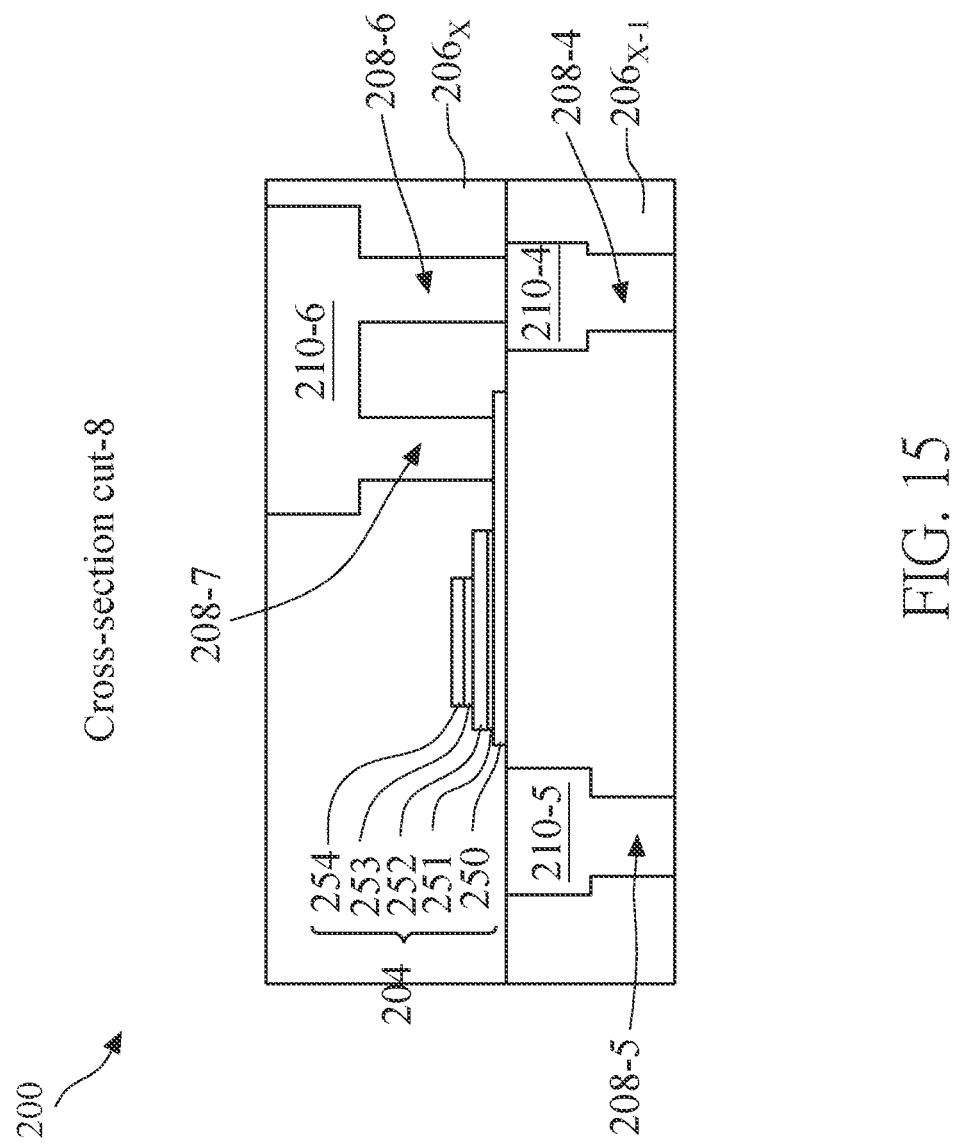

FIGS. 13, 14, and 15 are cross-sectional views of the device 200 along the "Cross-section cut-6" line, the "Cross-section cut-7" line, and the "Cross-section cut-8" line in FIG. 12, respectively. The features in FIGS. 13, 14, and 15 are the same as those in FIG. 3 in the fuse region, descriptions of which are omitted for simplicity.

FIG. 16A illustrates a fuse array (a 2×1 fuse array) in the device 200, according to another embodiment. This embodiment is the same as the embodiment shown in FIG. 1A, with one difference. In the embodiment shown in FIG. 1A, one fuse cell includes one control device 202 and one fuse element 204T or 204B, while two adjacent fuse cells 202 share a pair of fuse elements 204T and 204B. In the embodiment shown in FIG. 16A, one fuse cell includes one control device 202 and a pair of fuse elements 204T and 204B that are connected in parallel between the program line and the source terminal of the control device 202. FIG. 16A illustrates two such fuse cells. Effectively, the pair of fuse elements 204T and 204B are programmed at the same time and are sensed (or read) as one fuse unit. If at least one of them is programmed successfully, then the short circuit is established between the program line and the source terminal of the control device 202. This provides a very high reliability of the fuse operation. In the example illustrated in FIG. 16B, both fuse elements 204T and 204B are programmed successfully and function as low resistance paths (i.e., resistors) connected in parallel between the program line and the source terminal of the control device 202. This is a general case. In the example illustrated in FIG. 16C, the fuse element 204T is programmed successfully and provides a low resistance path, while the fuse element 204B fails to be programmed and remains as an open circuit. Such cases do not generally happen. However, even in such cases, the program line is connected to the source terminal of the control device 202 through a low resistance path (i.e., through the middle metal plate 252 and the top metal plate 254 in this case), and the operation of the fuse cell (or fuse unit) is deemed a success.

Figure 17:
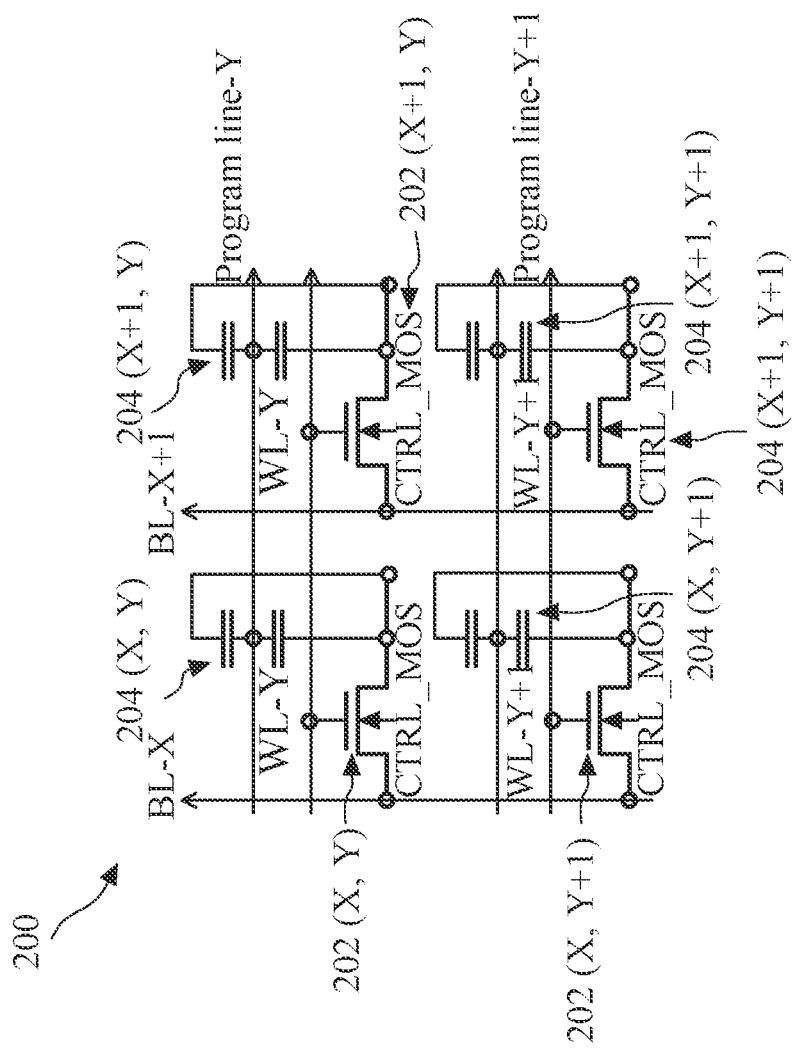

FIG. 17 illustrates a fuse array (a 2×2 fuse array) in the device 200, where each fuse cell includes a control device 202 and a pair of fuse elements 204T and 204B that are connected in parallel between the program line and the source terminal of the control device 202. Fuse cells in the same row share a common program line. Fuse cells in the same column share a common bit line. Other aspects are the same as those in FIG. 16A and are omitted for simplicity.

Figure 18:
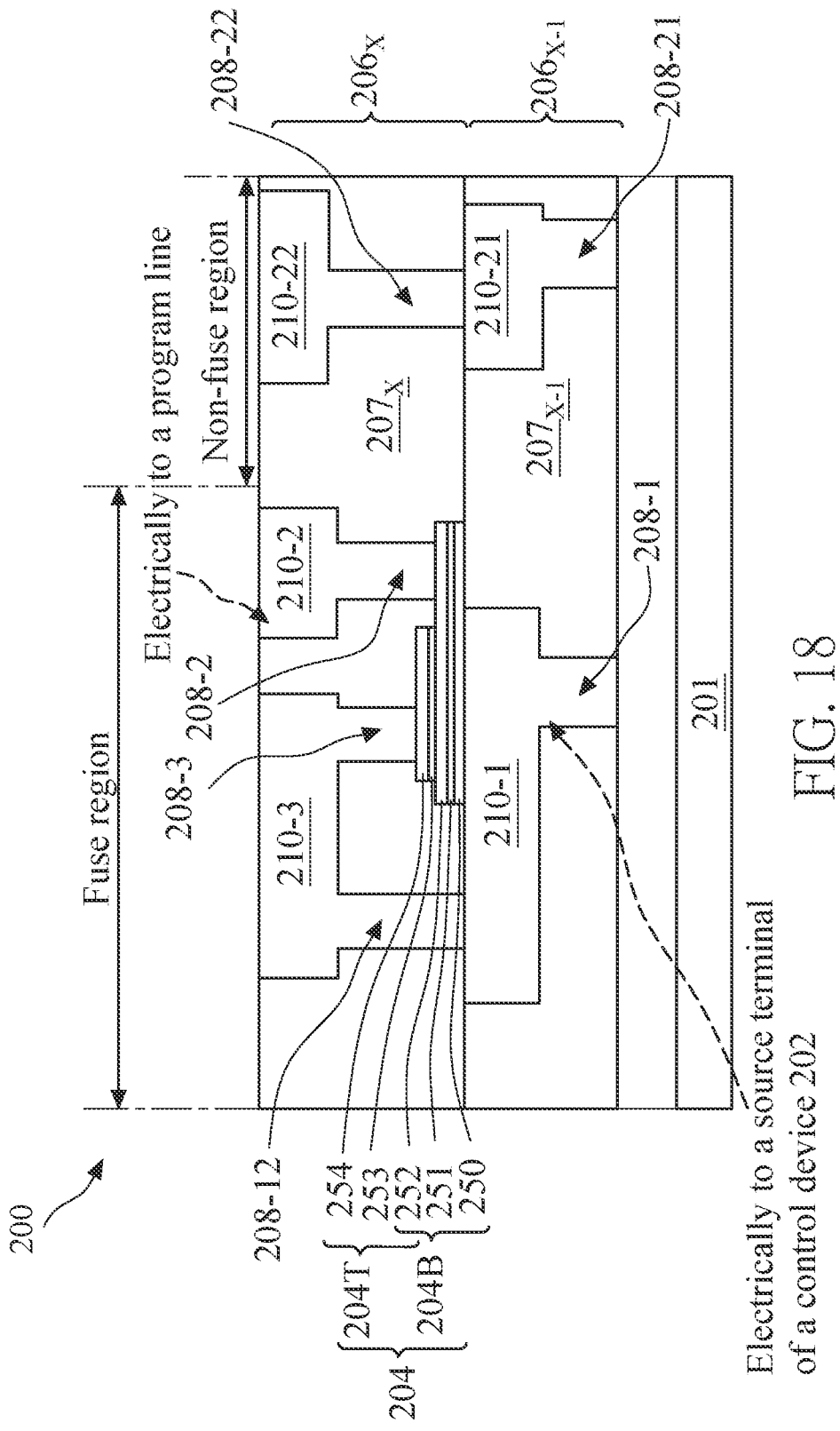

FIG. 18 illustrates a cross-sectional view of a portion of the fuse cell in FIG. 16A, according to an embodiment. Many features of the embodiment in FIG. 18 are the same as the embodiment in FIG. 2, with like reference numerals denoting like features in the two figures. These common features include the substrate 201, the interconnect layers $206_x$ and $206_{x-1}$, the dielectric layers $207_x$ and $207_{x-1}$, the vias 208, the metal lines 210, the metal plates 250, 252, and 254, and the insulators 251 and 253. For simplicity, descriptions of these features are not repeated. In the embodiment in FIG. 18, the device 200 further includes a via 208-12 in the interconnect layer $206_x$. The via 208-12 physically and electrically connects the metal line 210-3 to the metal line 210-1, thereby shorting the top metal plate 254 and the bottom metal plate 250 together.

Figure 19:
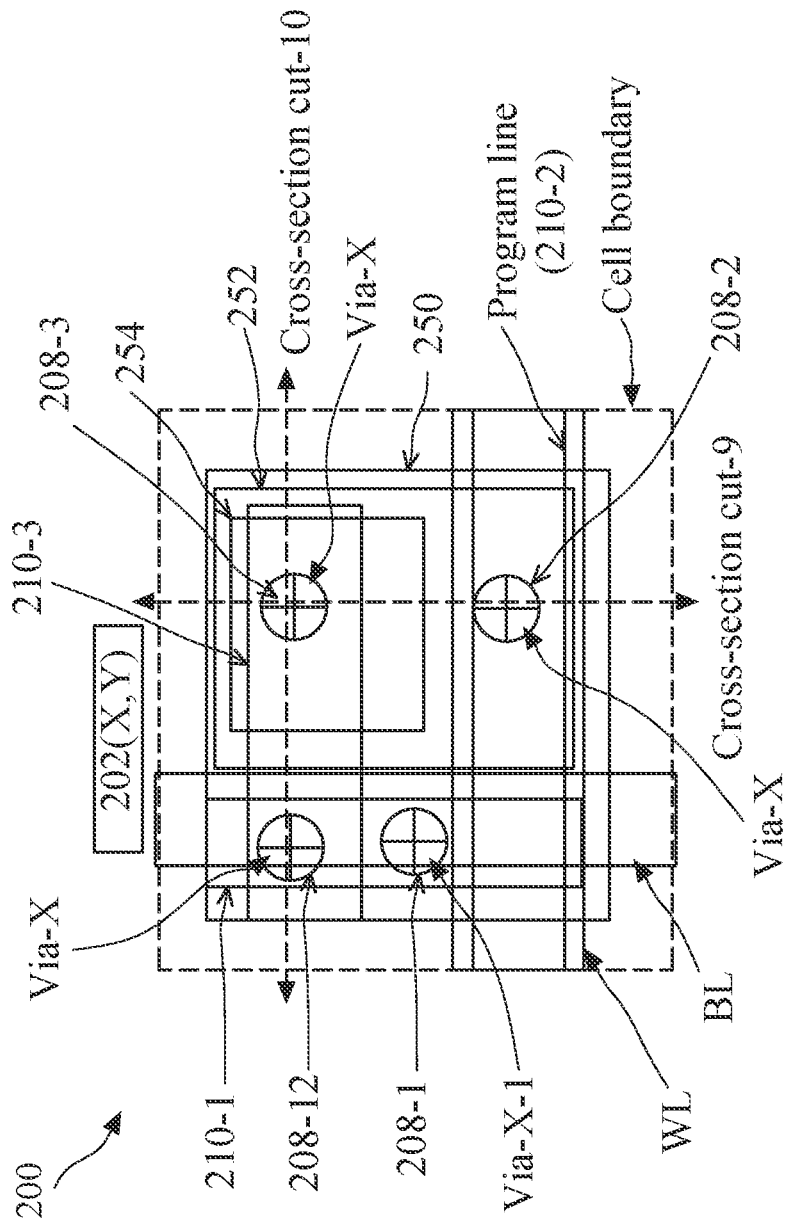

FIG. 19 illustrates a layout of a portion of the fuse array in FIG. 17 according to an embodiment. Particularly, FIG. 19 shows the layout of various metal features for the fuse element 204(X, Y). The underlying control device 202(X, Y) is indicated with a dashed box with a boundary ("Cell boundary"). FIG. 19 shows that from the top view, the bottom metal plate 250 is larger than the middle metal plate 252 that is in turn larger than the top metal plate 254. There is some clearance from the edges of the top metal plate 254 to the edges of the middle metal plate 252. There is also some clearance from the edges of the middle metal plate 252 to the edges of the bottom metal plate 250. The bit line BL-X is routed vertically (along the "y" direction). The (in-cell) program line and the word line WL are routed horizontally (along the "x") direction). In an embodiment, the bit line BL-X is routed in the M1 interconnect layer, the word line WL is routed in the M2 interconnect layer (i.e., the interconnect layer directly above the M1 interconnect layer), while the (in-cell) program line 210-2 is routed in an interconnect layer that is the M4 or higher interconnect layer (i.e., M4 layer, M5 layer, and so on).

Figure 20:
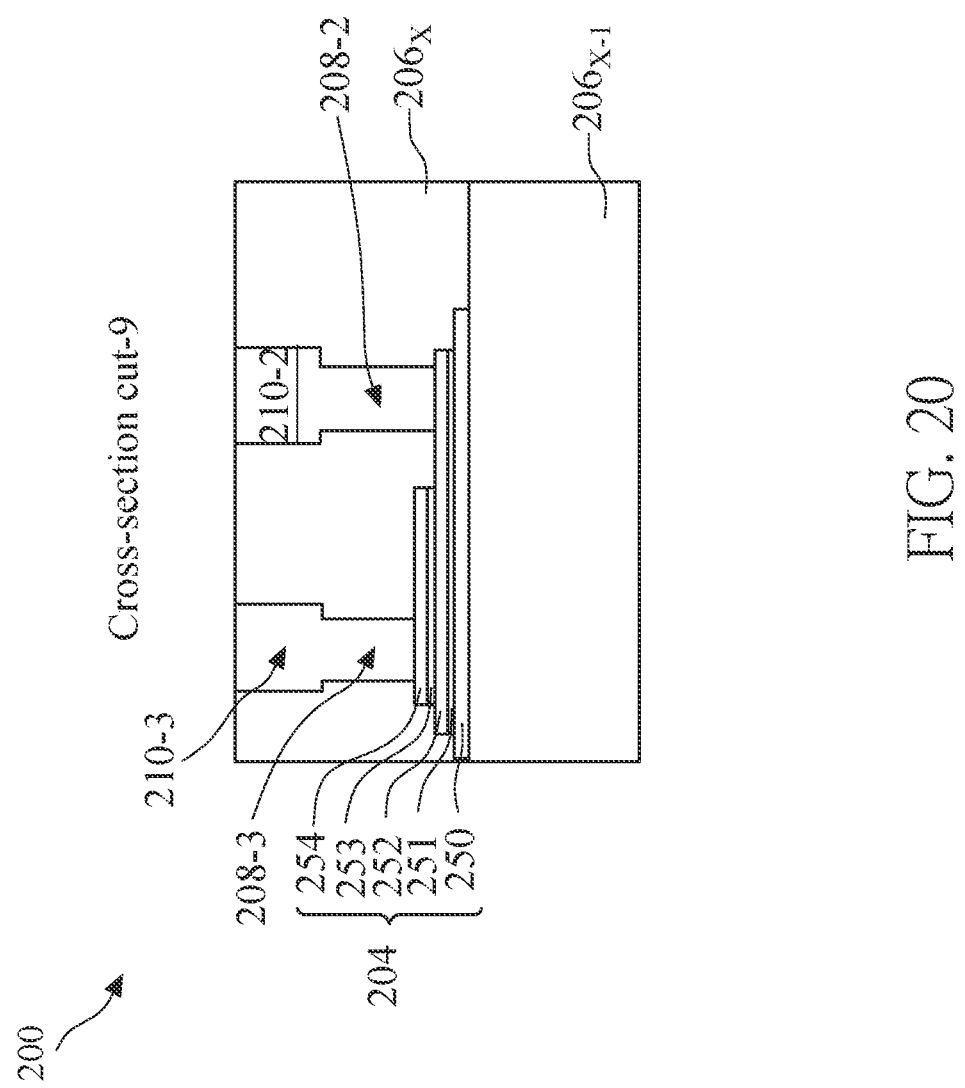
Figure 21:
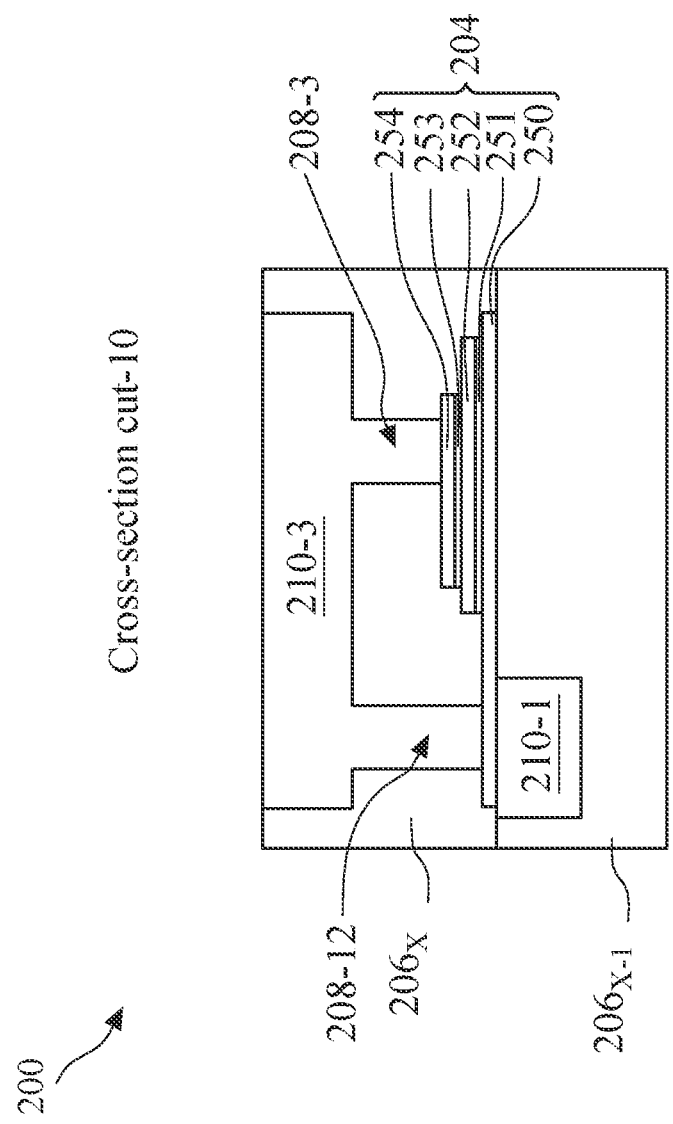

FIGS. 20 and 21 are cross-sectional views of the device 200 along the "Cross-section cut-9" line and the "Cross-section cut-10" line in FIG. 19, respectively. The features in FIGS. 20 and 21 are the same as those in FIG. 18 in the fuse region.

Figure 22:
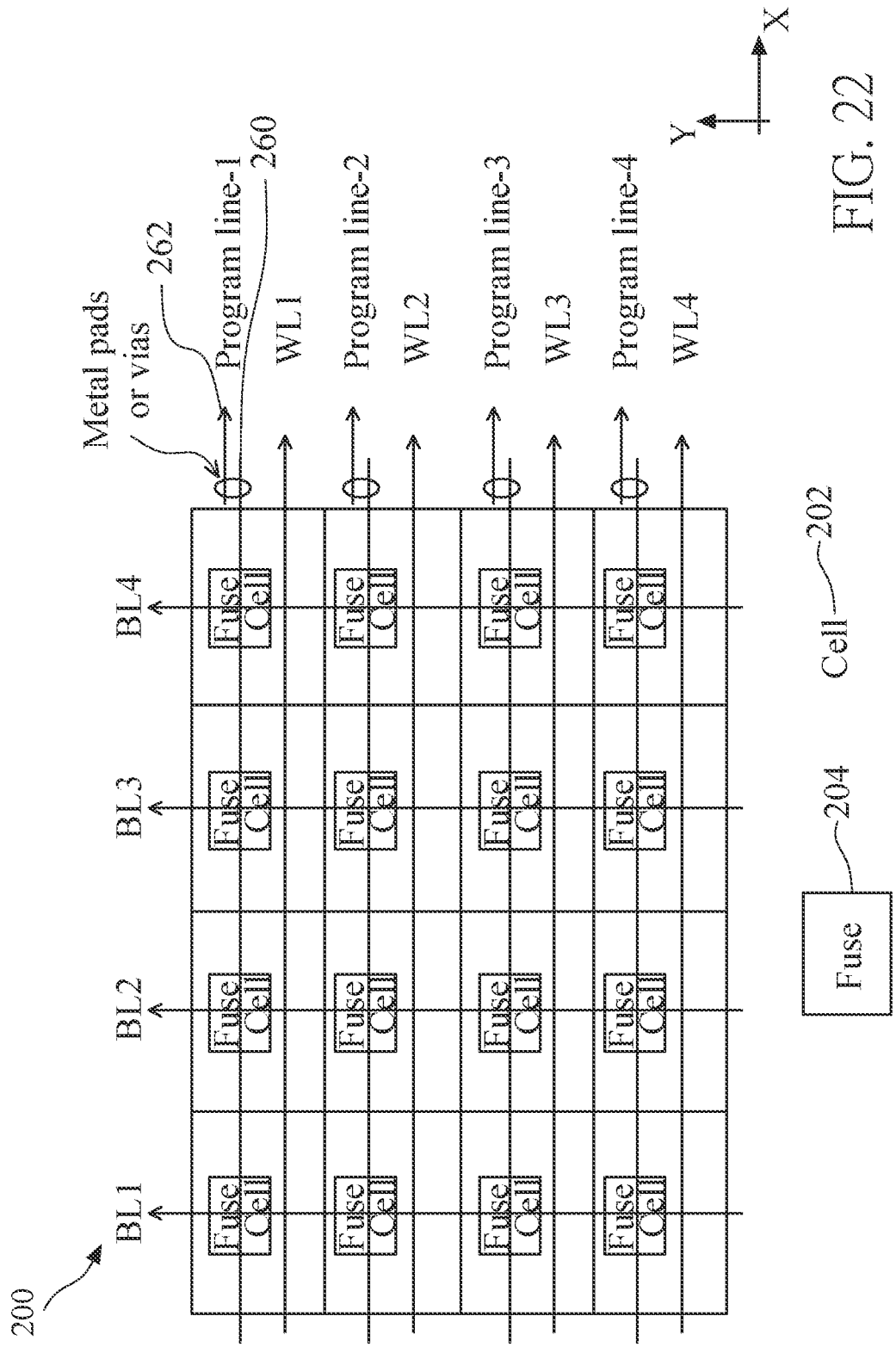

FIG. 22 illustrates the routing of certain signal lines in an example fuse array in the device 200, where fuse cell includes one control device 202 and a pair of fuse elements 204 (i.e., 204T and 204B) such as described with reference to FIG. 16A. In this example, the fuse array is a 4×4 array—having 4 control devices 202 per row and 4 control devices 202 per column. The control devices 202 are shown as "Cell" in this diagram. A pair of fuse elements 204 is connected in parallel to one Cell. Each pair of fuse elements 204 include a fuse element 204T vertically stacked atop another fuse element 204B as discussed with reference to FIG. 18. Other aspects in FIG. 22 are the same as those in FIG. 4, such as the routing of the program lines (including signal lines 262 and 260), the word lines, and the bit lines.

Figure 23:
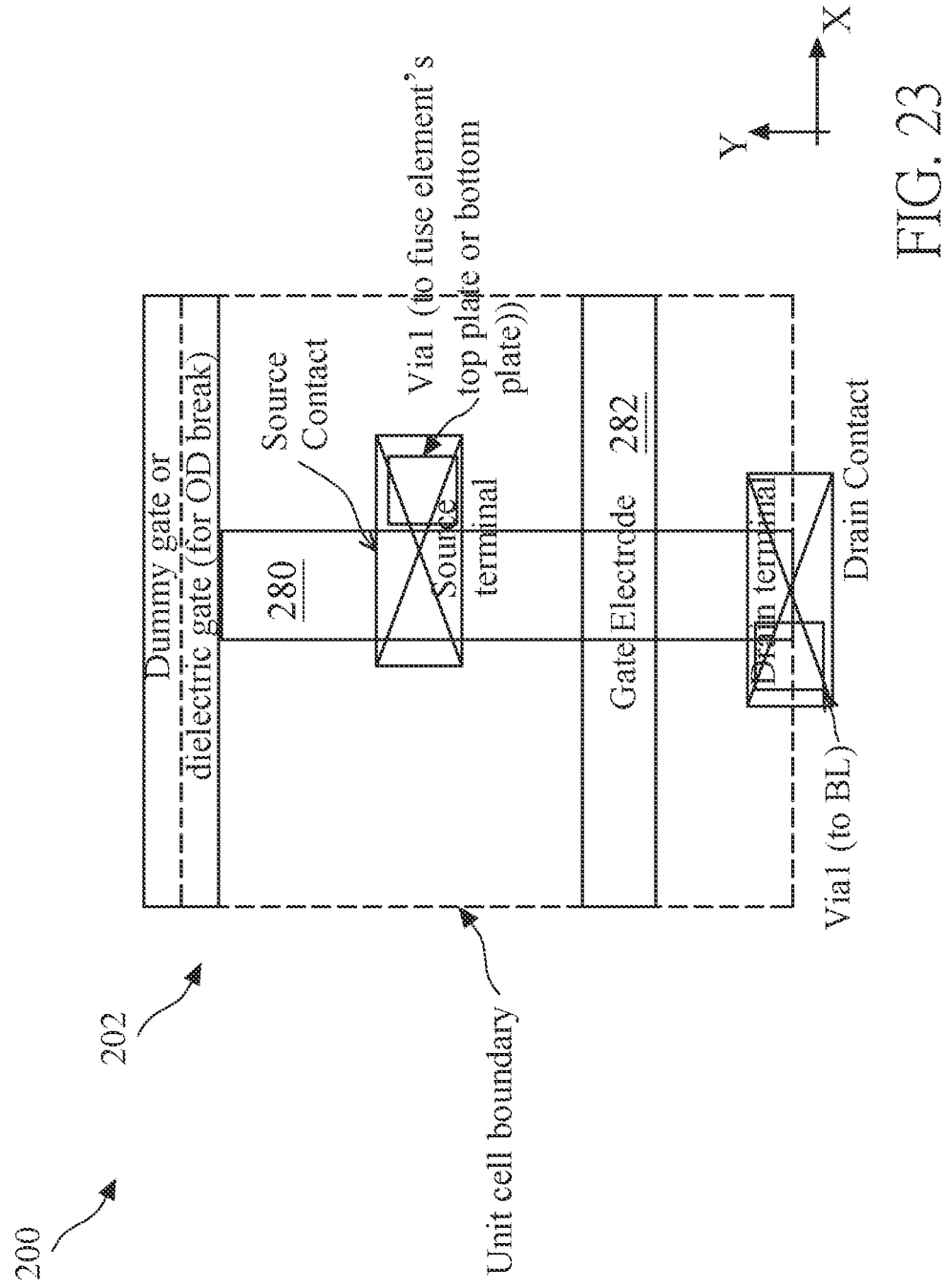
FIG. 23 illustrates a layout of a portion of a control device for a fuse array, according to an embodiment.

FIG. 23 illustrates a layout of the control device 202 according to an embodiment. The control device 202 includes an active region 280 oriented lengthwise along the "y" direction and a gate electrode 282 oriented lengthwise along the "x" direction that is perpendicular to the "y" direction. The gate electrode 282 engages the active region 282 to form an MOSFET. The active region 280 may be one block of semiconductor material or multiple fins of semiconductor material in some embodiments. The gate electrode 282 may be a high-k metal gate in an embodiment. The control device 202 further includes a source contact disposed in the source region of the active region 280 and a drain contact disposed in the drain region of the active region 280. The control device 202 further includes a via (first level via, via1) that connects the source contact to a fuse element's top metal plate 254 or bottom metal plate 250. The control device 202 further includes another via (first level via, via1) that connects the drain contact to the bit line BL. The device 200 also includes dummy gates or dielectric gates at the boundary of the control device 202 for isolation purposes.

Figure 24:
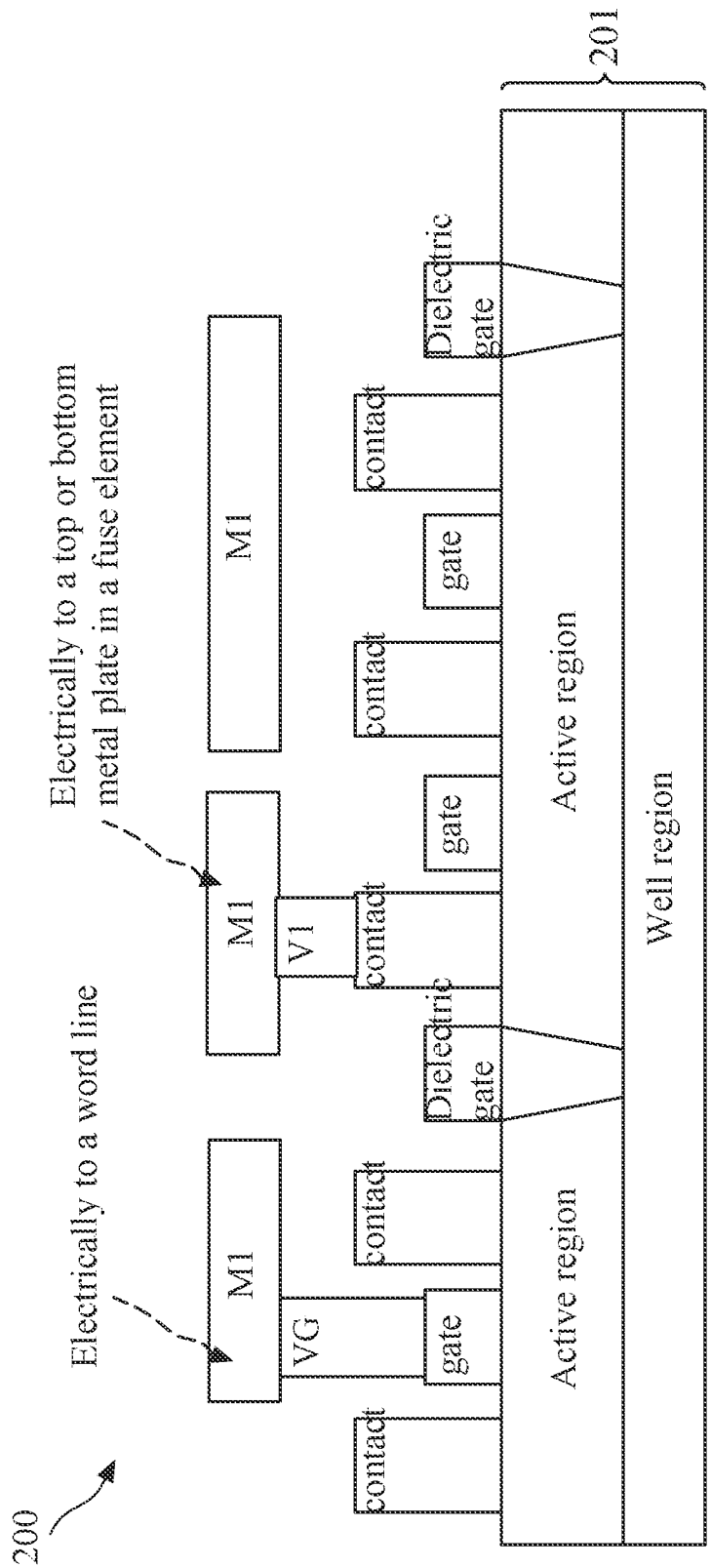
FIG. 24 illustrates a cross-sectional view of a portion of a semiconductor device having a fuse array integrated therewith, according to some embodiments.

FIG. 24 illustrates a cross-sectional view of a portion of the device 200 according to an embodiment. As illustrated, the substrate 201 includes well regions and active regions (e.g., doped with n-type or p-type dopants). The active regions are separated from each other by dielectric gates and/or other isolation features. The source region and the drain region of the control devices 202 are provided in the active regions. The gate electrodes (or gates) are disposed over the active regions to form MOSFETs. Contacts are disposed over the source terminals and drain terminals of the MOSFETs. Further, the gate electrodes are connected to metal lines in the M1 interconnect layer through vias VG, and the source and drain contacts are connected to metal lines in the M1 interconnect layer through vias V1. Even though not shown in FIG. 24, the device 200 further includes interconnect layers over the M1 interconnect layer, such as the M2 layer, the M3 layer, the M4 layer, the M5 layer, and so on. For example, one of the gate electrodes is electrically connected to a word line disposed in the M2 layer and one of the source contacts is electrically connected to a top or bottom metal plate of a fuse element 204 disposed in the M4 layer, according to an embodiment.

Although not intended to be limiting, one or more embodiments of the present disclosure provide many benefits to an integrated circuit and the formation thereof. For example, embodiments of the present disclosure provide a new type of anti-fuse (or fuse) that is implemented at metal layers and above the transistors. The new fuse structure provides two fuse cells with vertically stacked fuse elements for cell size reduction, and both terminals of each fuse element are metal plates. The new anti-fuse structure provides very reliable operations in both programming and reading. With this new fuse structure, the tuning of transistors and the fuses can be de-coupled, giving more freedom to tune the program voltage of the fuses. Embodiments of the present disclosure can be readily integrated into existing manufacturing flow.

In one example aspect, the present disclosure is directed to a semiconductor structure that includes first and second transistors where each of the first and the second transistors has a source terminal, a drain terminal, and a gate terminal. The semiconductor structure further includes a program line; a first metal plate over the first and the second transistors; a first insulator over the first metal plate; a second metal plate over the first insulator; a second insulator over the second metal plate; and a third metal plate over the second insulator. The first metal plate, the first insulator, and the second metal plate form a first anti-fuse element. The second metal plate, the second insulator, and the third metal plate form a second anti-fuse element. The source terminal of the first transistor is electrically connected to the first metal plate. The source terminal of the second transistor is electrically connected to the third metal plate. The program line is electrically connected to the second metal plate.

In an embodiment, the semiconductor structure further includes a first bit line that is electrically connected to the drain terminal of the first transistor and a second bit line that is electrically connected to the drain terminal of the second transistor. In a further embodiment, the semiconductor structure includes a word line that is electrically connected to the gate terminals of the first and the second transistors.

In some embodiments of the semiconductor structure, each of the first, the second, and the third metal plates includes titanium, titanium nitride, nickel, molybdenum, platinum, cobalt, ruthenium, tungsten, tantalum nitride, copper, or a combination thereof. In some embodiments, each of the first and the second insulators includes $SiO_2$, SiOC, SiON, SiOCN, $Si_3N_4$, carbon doped $SiO_2$, nitrogen doped $SiO_2$, carbon and nitrogen doped $SiO_2$, dielectric metal oxide, or a combination thereof. In an embodiment of the semiconductor structure, each of the first and the second insulators has a thickness in a range from about 5 Å to about 50 Å.

In an embodiment, the first metal plate is disposed over and physically contacts a first metal line that is electrically connected to the source terminal of the first transistor, the third metal plate is disposed below a second metal line and connects to the second metal line through a via, the second metal line is electrically connected to the source terminal of the second transistor, and the first and the second metal lines are in two adjacent interconnect layers. In a further embodiment, the second metal plate is disposed below a third metal line and connects to the third metal line through another via, and the second and the third metal lines are in a same interconnect layer.

In another embodiment, the first metal plate is disposed over a first metal line that is electrically connected to the source terminal of the first transistor, the first metal plate is disposed below a second metal line and connects to the second metal line through a first via, the second metal line is connected to the first metal line through a second via, and the first and the second metal lines are in two adjacent interconnect layers. In a further embodiment, the third metal plate is disposed over a third metal line that is electrically connected to the source terminal of the second transistor, the third metal plate is disposed below a fourth metal line and connects to the fourth metal line through a third via, the fourth metal line is connected to the third metal line through a fourth via, and the third and the fourth metal lines are in two adjacent interconnect layers. In another further embodiment, the second metal plate is disposed below a fifth metal line and connects to the fifth metal line through a fifth via, wherein the second, the fourth, and the fifth metal lines are in a same interconnect layer, and the first and the third metal lines are in a same interconnect layer.

In some embodiment, the semiconductor structure further includes a stack of metal layers disposed over the first and the second transistors, wherein the first metal plate, the first insulator, the second metal plate, the second insulator, and the third metal plate are disposed between a first metal layer and a second metal layer directly above the first metal layer in the stack of metal layers, and at least two metal layers of the stack of metal layers are below the first metal layer.

In another example aspect, the present disclosure is directed to a semiconductor structure that includes first and second transistors, each of the first and the second transistors having a source terminal, a drain terminal, and a gate terminal. The semiconductor structure further includes a word line conductor that is electrically connected to the gate terminals of the first and the second transistors; a program line conductor; and a vertically stacked dual anti-fuse elements. The vertically stacked dual anti-fuse elements includes first, second, and third metal plates stacked over the first and the second transistors and separated from each other by insulators. The source terminal of the first transistor is electrically connected to the first metal plate, the source terminal of the second transistor is electrically connected to the third metal plate, and the program line conductor is electrically connected to the second metal plate.

In an embodiment, the semiconductor structure further includes a first bit line conductor that is electrically connected to the drain terminal of the first transistor and a second bit line conductor that is electrically connected to the drain terminal of the second transistor. In some embodiments, each of the first, the second, and the third metal plates includes titanium, titanium nitride, nickel, molybdenum, platinum, cobalt, ruthenium, tungsten, tantalum nitride, copper, or a combination thereof. In some embodiments, the insulators include $SiO_2$, SiOC, SiON, SiOCN, $Si_3N_4$, carbon doped $SiO_2$, nitrogen doped $SiO_2$, carbon and nitrogen doped $SiO_2$, $HfO_2$, $Ta_2O_5$, $TiO_2$, $ZrO_2$, $Al_2O_3$, $Y_2O_3$, or a combination thereof.

In some embodiments, the semiconductor structure further includes a vertical stack of metal layers disposed over the first and the second transistors, wherein the vertically stacked dual anti-fuse elements are disposed between two adjacent layers of the vertical stack of metal layers.

In yet another example aspect, the present disclosure is directed to a semiconductor structure that includes a first transistor having a source terminal, a drain terminal, and a gate terminal; a word line conductor that is electrically connected to the gate terminal of the first transistor; a bit line conductor that is electrically connected to the drain terminal of the first transistor; a program line conductor; and a vertically stacked dual anti-fuse elements. The vertically stacked dual anti-fuse elements includes a stack of three metal plates separated from each other by insulators. The source terminal of the first transistor is electrically connected to a bottom one and a top one of the three metal plates, and the program line conductor is electrically connected to a middle one of the three metal plates.

In an embodiment of the semiconductor structure, each of the three metal plates includes titanium, titanium nitride, nickel, molybdenum, platinum, cobalt, ruthenium, tungsten, tantalum nitride, copper, or a combination thereof. In another embodiment of the semiconductor structure, the insulators include $SiO_2$, SiOC, SiON, SiOCN, $Si_3N_4$, carbon doped $SiO_2$, nitrogen doped $SiO_2$, carbon and nitrogen doped $SiO_2$, dielectric metal oxide, or a combination thereof.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    first and second transistors, each of the first and the second transistors having a source terminal, a drain terminal, and a gate terminal;
    a program line;
    a first metal plate over the first and the second transistors;
    a first insulator over the first metal plate;
    a second metal plate over the first insulator;
    a second insulator over the second metal plate; and
    a third metal plate over the second insulator, wherein the first metal plate, the first insulator, and the second metal plate form a first anti-fuse element, wherein the second metal plate, the second insulator, and the third metal plate form a second anti- fuse element, wherein the source terminal of the first transistor is electrically connected to the first metal plate, the source terminal of the second transistor is electrically connected to the third metal plate, and the program line is electrically connected to the second metal plate.

2. The semiconductor structure of claim 1, further comprising:
    a first bit line that is electrically connected to the drain terminal of the first transistor; and
    a second bit line that is electrically connected to the drain terminal of the second transistor.

3. The semiconductor structure of claim 2, further comprising:
    a word line that is electrically connected to the gate terminal of the first transistor and the gate terminal of the second transistor.

4. The semiconductor structure of claim 1, wherein each of the first, the second, and the third metal plates includes at least one member selected from the group consisting of titanium, titanium nitride, nickel, molybdenum, platinum, cobalt, ruthenium, tungsten, tantalum nitride, copper, and combinations thereof.

5. The semiconductor structure of claim 1, wherein each of the first and the second insulators includes at least one member selected from the group consisting of $SiO_2$, SiOC, SiON, SiOCN, $Si_3N_4$, carbon doped $SiO_2$, nitrogen doped $SiO_2$, carbon and nitrogen doped $SiO_2$, dielectric metal oxide, and combinations thereof.

6. The semiconductor structure of claim 1, wherein each of the first and the second insulators has a thickness in a range from about 5 Å to about 50 Å.

7. The semiconductor structure of claim 1, wherein the first metal plate is disposed over and physically contacts a first metal line that is electrically connected to the source terminal of the first transistor, wherein the third metal plate is disposed below a second metal line and connects to the second metal line through a via, wherein the second metal line is electrically connected to the source terminal of the second transistor, wherein the first and the second metal lines are in two adjacent interconnect layers.

8. The semiconductor structure of claim 7, wherein the second metal plate is disposed below a third metal line and connects to the third metal line through another via, wherein the second and the third metal lines are in a same interconnect layer.

9. The semiconductor structure of claim 1, wherein the first metal plate is disposed over a first metal line that is electrically connected to the source terminal of the first transistor, the first metal plate is disposed below a second metal line and connects to the second metal line through a first via, and the second metal line is connected to the first metal line through a second via, wherein the first and the second metal lines are in two adjacent interconnect layers.

10. The semiconductor structure of claim 9, wherein the third metal plate is disposed over a third metal line that is electrically connected to the source terminal of the second transistor, the third metal plate is disposed below a fourth metal line and connects to the fourth metal line through a third via, and the fourth metal line is connected to the third metal line through a fourth via, wherein the third and the fourth metal lines are in two adjacent interconnect layers.

11. The semiconductor structure of claim 10, wherein the second metal plate is disposed below a fifth metal line and connects to the fifth metal line through a fifth via, wherein the second, the fourth, and the fifth metal lines are in a same interconnect layer, wherein the first and the third metal lines are in a same interconnect layer.

12. The semiconductor structure of claim 1, further comprising a stack of metal layers disposed over the first and the second transistors, wherein the first metal plate, the first insulator, the second metal plate, the second insulator, and the third metal plate are disposed between a first metal layer and a second metal layer directly above the first metal layer in the stack of metal layers, wherein at least two metal layers of the stack of metal layers are below the first metal layer.

13. A semiconductor structure, comprising:
first and second transistors, each of the first and the second transistors having a source terminal, a drain terminal, and a gate terminal;
a word line conductor that is electrically connected to the gate terminals of the first and the second transistors;
a program line conductor; and
a vertically stacked dual anti-fuse elements, wherein the vertically stacked dual anti-fuse elements includes first, second, and third metal plates stacked over the first and the second transistors and separated from each other by insulators, wherein the source terminal of the first transistor is electrically connected to the first metal plate, the source terminal of the second transistor is electrically connected to the third metal plate, and the program line conductor is electrically connected to the second metal plate.

14. The semiconductor structure of claim 13, further comprising:
a first bit line conductor that is electrically connected to the drain terminal of the first transistor; and
a second bit line conductor that is electrically connected to the drain terminal of the second transistor.

15. The semiconductor structure of claim 13, wherein each of the first, the second, and the third metal plates includes at least one member selected from the group consisting of titanium, titanium nitride, nickel, molybdenum, platinum, cobalt, ruthenium, tungsten, tantalum nitride, copper, and combinations thereof.

16. The semiconductor structure of claim 13, wherein the insulators include at least one member selected from the group consisting of $SiO_2$, SiOC, SiON, SiOCN, $Si_3N_4$, carbon doped $SiO_2$, nitrogen doped $SiO_2$, carbon and nitrogen doped $SiO_2$, $HfO_2$, $Ta_2O_5$, $TiO_2$, $ZrO_2$, $Al_2O_3$, $Y_2O_3$, and combinations thereof.

17. The semiconductor structure of claim 13, further comprising a vertical stack of metal layers disposed over the first and the second transistors, wherein the vertically stacked dual anti-fuse elements are disposed between two adjacent layers of the vertical stack of metal layers.

18. A semiconductor structure, comprising:
a first transistor having a source terminal, a drain terminal, and a gate terminal;
a word line conductor that is electrically connected to the gate terminal of the first transistor;
a bit line conductor that is electrically connected to the drain terminal of the first transistor;
a program line conductor; and
a vertically stacked dual anti-fuse elements, wherein the vertically stacked dual anti-fuse elements includes a stack of three metal plates separated from each other by insulators, wherein the source terminal of the first transistor is electrically connected to a bottom one and a top one of the three metal plates, and the program line conductor is electrically connected to a middle one of the three metal plates.

19. The semiconductor structure of claim 18, wherein each of the three metal plates includes at least one member selected from the group consisting of titanium, titanium nitride, nickel, molybdenum, platinum, cobalt, ruthenium, tungsten, tantalum nitride, copper, and combinations thereof.

20. The semiconductor structure of claim 18, wherein the insulators include at least one member selected from the group consisting of $SiO_2$, SiOC, SiON, SiOCN, $Si_3N_4$, carbon doped $SiO_2$, nitrogen doped $SiO_2$, carbon and nitrogen doped $SiO_2$, dielectric metal oxide, and combinations thereof.

* * * * *